(12) United States Patent
Yamamoto et al.

(10) Patent No.: US 8,029,653 B2
(45) Date of Patent: Oct. 4, 2011

(54) ELECTROPLATING APPARATUS AND ELECTROPLATING METHOD

(75) Inventors: Satoru Yamamoto, Tokyo (JP); Keiichi Kurashina, Tokyo (JP); Takashi Kawakami, Tokyo (JP); Tsutomu Nakada, Tokyo (JP); Hiroyuki Kanda, Tokyo (JP); Junji Kunisawa, Tokyo (JP); Kunihito Ide, Tokyo (JP)

(73) Assignee: Ebara Corporation, Tokyo (JP)

( * ) Notice: Subject to any disclaimer, the term of this patent is extended or adjusted under 35 U.S.C. 154(b) by 1231 days.

(21) Appl. No.: 11/708,548

(22) Filed: Feb. 21, 2007

(65) Prior Publication Data

US 2008/0029398 A1 Feb. 7, 2008

(30) Foreign Application Priority Data

Feb. 21, 2006 (JP) .................. 2006-044264
Dec. 14, 2006 (JP) .................. 2006-336481
Feb. 14, 2007 (JP) .................. 2007-033221

(51) Int. Cl.
*C25D 17/00* (2006.01)
(52) U.S. Cl. ..................... 204/272; 204/242
(58) Field of Classification Search .............. 204/242, 204/272
See application file for complete search history.

(56) References Cited

U.S. PATENT DOCUMENTS

| 6,391,166 | B1 | 5/2002 | Wang |
| 6,497,801 | B1 | 12/2002 | Woodruff et al. |
| 2002/0020627 | A1* | 2/2002 | Kunisawa et al. ............ 205/96 |
| 2008/0121526 | A1* | 5/2008 | Hsiao et al. ............ 205/80 |

* cited by examiner

*Primary Examiner* — Alexa D. Neckel
*Assistant Examiner* — Nicholas A. Smith
(74) *Attorney, Agent, or Firm* — Wenderoth, Lind & Ponack, L.L.P.

(57) ABSTRACT

An electroplating apparatus can form a plated film having a more uniform thickness and good film quality over an entire surface of a substrate having a conductive layer (seed layer) whose resistivity is equal to or higher than that of copper. The electroplating apparatus includes: a substrate holder for holding a substrate; a sealing member for contact with a peripheral portion of a surface of a substrate, held by the substrate holder, to seal the peripheral portion; a cathode contact for contact with a conductive layer formed in the surface of the substrate, held by the substrate holder, to feed electricity to the conductive layer; and a housing having therein an anode to be immersed in a plating solution, and a porous structure disposed at an open end facing the substrate held by the substrate holder, said porous structure defining a plating chamber in the housing; wherein the plating chamber is divided into rooms by a partition plate and the porous structure, and the anode is comprised of a plurality of divided anodes, each divided anode being disposed in each room of the plating chamber so that each divided anode can pass an independent plating current.

7 Claims, 22 Drawing Sheets

FIG. 19A
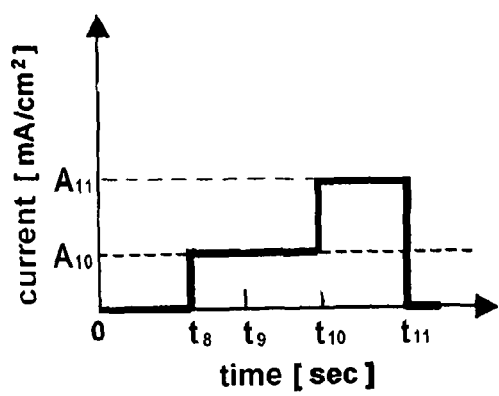
FIG. 19B
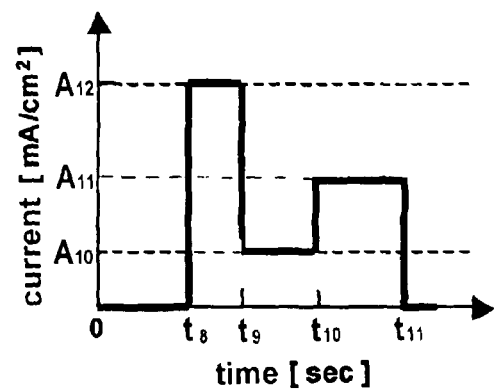
FIG. 20A
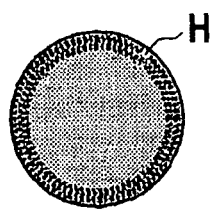
FIG. 20B
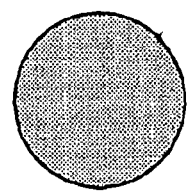

ELECTROPLATING APPARATUS AND ELECTROPLATING METHOD

BACKGROUND OF THE INVENTION

1. Field of the Invention

The present invention relates to an electroplating apparatus and an electroplating method, and more particularly to an electroplating apparatus and an electroplating method useful for filling fine interconnect pattern formed in a surface of a substrate (surface to be plated), such as a semiconductor wafer, with a metal, such as copper, to form embedded interconnects.

2. Description of the Related Art

In recent years, instead of using aluminum or aluminum alloys as a material for forming circuits on a semiconductor substrate, there is an eminent movement towards using copper (Cu) which has a low electric resistivity and high electromigration resistance. Copper interconnects are generally formed by filling copper into fine interconnect recesses formed in a surface of a substrate. There are known various techniques for forming such copper interconnects, including chemical vapor deposition (CVD), sputtering, and plating. According to any such technique, a copper film is formed in a substantially entire surface of a substrate, followed by removal of unnecessary copper by chemical mechanical polishing (CMP).

FIGS. 28A through 28C illustrate, in a sequence of process steps, an example of forming such a substrate W having copper interconnects. First, as shown in FIG. 28A, an insulating film (interlevel dielectric film) 2 of $SiO_2$ or low-k material is deposited on a conductive layer 1a in which semiconductor devices are formed, which is formed on a semiconductor base 1. Contact holes 3 and trenches 4 for interconnect recesses are formed in the insulating film 2 by the lithography/etching technique. Thereafter, a barrier layer 5 of TaN, TiN or the like is formed on the surface, and a seed layer 7 as an electric supply layer for electroplating is formed on the barrier layer 5.

Then, as shown in FIG. 28B, copper plating is performed onto the surface of the substrate W to fill the contact holes 3 and the trenches 4 with copper and, at the same time, deposit a copper film 6 on the insulating film 2. Thereafter, the copper film 6, the seed layer 7 and the barrier layer 5 on the insulating film 2 are removed by chemical mechanical polishing (CMP) so as to make the surface of the copper film 6 filled in the contact holes 3 and the trenches 4 for interconnects and the surface of the insulating film 2 lie substantially on the same plane. Interconnects composed of the copper film 6 are thus formed in the insulating film 2, as shown in FIG. 28C.

When carrying out electroplating of a surface of a substrate, as shown in FIG. 29, a cathode contact 200 brings into contact with a peripheral region of an conductive layer, such as a seed layer 7, formed on a surface of a substrate W, and a plating solution 204 is filled into between the substrate W and an anode 202 disposed opposite the substrate W. A plated film is deposited on the conductive layer of the substrate W by passing a plating current between the cathode contact 200 and the anode 202 from a power source 206.

Semiconductor wafers and liquid crystal substrates for LSI's tend to increase in area year by year. In line with this tendency, the substrates are posing problems. In detail, as the area of the substrate W increases, the electric resistance (sheet resistance) of the conductive layer, such as a seed layer 7, ranging from the cathode contact 200 on the periphery of the substrate W to the center of the substrate W also increases. As a result, a potential difference produces in-plane of the substrate W, causing a difference in the plating rate. FIG. 29 is an electrical equivalent circuit diagram of general electroplating, and the following resistance components exist in this circuit:

R1: Power source wire resistance between power source 206 and anode 202, and various contact resistances
R2: Polarization resistance at anode 202
R3: Resistance of plating solution 204
R4: Polarization resistance at cathode contact
R5: Resistance of conductive layer (sheet resistance)
R6: Power source wire resistance between cathode contact and power source 206, and various contact resistances As can be seen from FIG. 29, when the resistance R5 of the conductive layer becomes higher than the other electric resistances R1 to R4 and R6, the potential difference arising between both ends of this resistance R5 of the conductive layer increases, and accordingly, a difference occurs in the plating current. Thus, the plated film growth rate lowers at a position distant from the cathode contact 200. If a film thickness of the conductive layer is small, the resistance R5 further increases, and this phenomenon appears conspicuously. This phenomenon, called terminal effect, means that the current density differs in-plane of the substrate W, and the characteristics of a plated film itself (resistivity, purity, burial characteristics, etc. of the plated film) are not uniform in-plane.

As a method for avoiding these problems, it is conceivable to increase the thickness of the conductive layer or decrease the electric conductivity of the conductive layer. However, the substrate is subject to various restrictions even in manufacturing steps other than plating. For example, when a thick conductive layer is formed on a fine pattern by sputtering, voids easily occur inside the pattern. Thus, it is impossible to easily increase the thickness of the conductive layer or change the film type of the conductive layer.

In order to solve above problem, the applicant has proposed a plating apparatus wherein a high resistance structure 208, which has lower electric resistivity than the electric resistivity of the plating solution, is disposed between an anode 202 and a substrate W, as shown in FIG. 30. With this structure, an electric equivalent circuit diagram is shown in FIG. 30, and a resistance Rp of the high resistance structure 208 is added as compared to the electric equivalent circuit diagram shown in FIG. 29. Therefore, if a value of the resistance Rp of the high resistance structure 208 becomes high, a value ((R2+R3+Rp+R4)/(R2+R3+Rp+R4+R5)) comes near one, the influence of the resistance R5, i.e., a resistant factor (sheet resistance) of the conductive layer becomes low.

A copper seed layer, formed by, e.g., sputtering, CVD, ALD or electroless plating, is generally used as the seed layer 7; and such a copper seed layer is becoming thinner year by year with the progress toward finer interconnects. For example, a thickness of a copper seed layer in the field region of a substrate is around 600 angstrom in the manufacturing of a 65 nm-generation semiconductor device. A thickness of a copper seed layer is expected to be not more than 500 angstrom in a 45 nm-generation. In the next generation and the following generation, it is expected that a thickness of a copper seed layer will be not more than 300 angstrom, or that copper will be plated directly on a surface of a barrier layer of, e.g., ruthenium without forming a copper seed layer.

The electric resistance (sheet resistance) of a current copper seed layer having the above thickness is not more than 1 $\Omega$/sq. The terminal effect, which depends on the sheet resistance of such a seed layer, can be reduced by interposing a resistor body between a substrate, which is connected to a cathode contact and serves as a cathode, and an anode, or by decreasing the acid concentration of a plating solution so as to increase the resistance of the plating solution itself. This can prevent a copper plated film from becoming thinner in the central portion of the substrate than in the peripheral portion, enabling the formation of a copper film having a uniform thickness on the surface of the substrate.

The applicant has proposed the use of divided anodes in any desired shape or the use of an insoluble anode (see Japanese Patent Laid-Open Publication Nos. 2002-129383 and 2005-213610). The applicant has also proposed to apply a voltage between an anode and a surface (conductive layer) of a substrate when placing the substrate into a plating bath, the voltage being such as to provide an average cathode current density of 1 to 30 mA/cm$^2$ for the surface (conductive layer) of the substrate (see Japanese Patent Laid-Open Publication No. 2004-218080). It has also been proposed to control a thickness of a plated film by electrical control using a switching mechanism that includes a number of power sources or resistances.

SUMMARY OF THE INVENTION

However, as semiconductor devices are becoming finer these days, a conductive layer such as a seed layer, formed on a surface of a substrate, such as a semiconductor wafer, is becoming increasingly thinner. The electric resistance (sheet resistance) of such a conductive layer is therefore becoming higher and higher. Accordingly, it is becoming difficult to form on a substrate a plated film having a uniform thickness over an entire substrate surface even when divided anodes are used. Though a plated film having a sufficient in-plane uniformity of thickness may be formed in the current 65 nm-node generation, variation in the thickness of a plated film, formed on a surface of a substrate, is considered to become larger with the shift to the next 45 nm-node generation and further to the subsequent 32 nm-node generation. Thus, it will become more and more difficult to form a plated film having a sufficient in-plane uniformity of thickness.

If a ruthenium seed layer, for example, is used to be adapted to a thin seed layer, the resistance of the substrate becomes further higher. A problem will also arise, as the resistance of a seed layer becomes higher, that a good film quality cannot be obtained with a conventional electric current recipe.

Thus, in semiconductor devices in the next generation and the following generation when interconnects will become further finer, copper seed layers will become increasingly thinner to a sheet resistance of not less than 1 Ω/sq or, in case copper is plated directly on a surface of a barrier layer of, e.g., ruthenium without forming a copper seed layer, the sheet resistance can be even not less than 10 Ω/sq. For a substrate having such a high sheet resistance, the terminal effect caused by the sheet resistance will be counteracted insufficiently only by the provision of a resistor body between the substrate and an anode or by the use of a high-resistance plating solution. Thus, it will be difficult with such countermeasures to form a copper film having a uniform thickness over the entire surface of the substrate.

The present invention has been made in view of the above situation. It is therefore an object of the present invention to provide an electroplating apparatus and an electroplating method which can form a plated film having a more uniform thickness and good film quality over an entire surface of a substrate having a conductive layer (seed layer) whose resistivity is equal to or higher than that of copper.

In order to achieve the above object, the present invention provides an electroplating apparatus comprising: a substrate holder for holding a substrate; a sealing member for contact with a peripheral portion of a surface of a substrate, held by the substrate holder, to seal the peripheral portion; a cathode contact for contact with a conductive layer formed in the surface of the substrate, held by the substrate holder, to feed electricity to the conductive layer; and a housing having therein an anode to be immersed in a plating solution, and a porous structure disposed at an open end facing the substrate held by the substrate holder, in which the porous structure defines a plating chamber in the housing. The plating chamber is divided into rooms by a partition plate and the porous structure, and the anode is comprised of a plurality of divided anodes, each divided anode being disposed in each room of the plating chamber so that each divided anode can pass an independent plating current.

This makes it possible to make the current density of a centrally-located divided anode higher than that of a peripheral divided anode, e.g., for a predetermined period of time during which an initial plated film is formed on a substrate, thereby preventing concentration of electric current in the peripheral portion of the substrate and allowing passage of electric current to the central portion of the substrate. This is effective against the terminal effect, i.e., can decrease the in-plane difference in current density due to the sheet resistance of the substrate surface even when the substrate has a high sheet resistance, ensuring the formation of a plated film having a more uniform thickness. Furthermore, this can prevent the respective electric fields of the divided anodes from interfering with each other, thus preventing a decrease in the effect of the use of the divided anodes.

Preferably, a sealing ring is interposed between the porous structure and the partition plate and/or between the partition plate and the housing.

By thus sealing with the sealing ring between the porous structure and the partition plate and/or between the partition plate and the housing, leakage of electric current through a plating solution can be fully prevented.

Preferably, the anode is comprised of concentric divided anodes, with a centrally-located divided anode being disk-shaped, and the partition plate has a cylindrical shape and is disposed such that it surrounds the circumference of the divided anode located inside.

This prevents dispersion of the electric field and allows passage of a specialized electric current to the central portion of a substrate, facing the centrally-located disk-shaped divided anode, thereby promoting plating in the central portion of the substrate while reducing the influence of the sheet resistance of a conductive layer. The anode may be either a soluble anode or an insoluble anode.

Preferably, the diameter of the disk-shaped divided anode and the inner diameter of the partition plate, disposed such that it surrounds the circumference of the disk-shaped divided anode, are each not more than ⅔ of the diameter of the substrate.

When forming a plated film on a surface of a wafer having a diameter of, e.g., 300 mm, the diameter of the centrally-located disk-shaped divided anode, and the inner diameter of the partition plate surrounding the circumference of the disk-shaped divided anode are each preferably not more than 200 mm and not less than 60 mm.

Preferably, the distance between the divided anodes and the porous structure is not more than 10 mm.

By disposing the divided anodes as close as possible to the porous structure, a specialized electric current can be easily passed to the central portion of the substrate.

The conductive layer may comprise one of Cu, Ru, Ta, TaN, W, WNC, WC, Pt, ITO, Ti, and TiW.

Such a conductive layer has a resistivity which is equal to or higher than that of copper, and uniform plating on the conductive layer is generally more difficult than on a copper film.

The present invention provides an electroplating method comprising: filling a plating solution into the region between a conductive layer of a substrate, the conductive layer being in contact with a cathode contact, and a plurality of concentric divided anodes disposed opposite the conductive layer; disposing a porous structure in the plating solution; and passing an electric current at a higher current density between the cathode contact and a centrally-located divided anode than between the cathode contact and the other divided anode(s) during an initial plating period.

This can perform plating more effectively against the terminal effect and form a plated film having a more uniform thickness.

Preferably, the electric current passed between the cathode contact and the centrally-located divided anode in the initial plating period provides an average cathode current density of not less than 40 mA/cm$^2$ and not more than 60 mA/cm$^2$ for the conductive layer of the substrate.

The initial plating period is, for example, within 5000 msec, preferably from 0 to 3000 msec, after the initiation of plating.

By permitting broadness for the initial plating period, good embedding can be performed for a variety of fine electrical circuit patterns. It is possible to pass an electric current, which provides an average cathode current density of not less than 40 mA/cm$^2$ for the conductive layer of the substrate, a plurality of times within 5000 msec after the initiation of plating. The present plating method is applicable to either hot entry or cold entry of the substrate into the plating solution.

Preferably, after the initial plating period, an electric current, which is lower than that of the initial plating period, is passed between the cathode contact and the centrally-located divided anode.

A plated film having a uniform thickness over an entire surface of a substrate can be formed by passing an electric current at a high current density between the cathode contact and the centrally-located divided anode in the initial plating period, and subsequently passing a second (ordinary) electric current which is lower than the first electric current. The plated film formed can be of fine crystal grains even in the center of the substrate which is distant from the contact, and can be a glossy, good-quality plated film. After the plating with the second plating current, an electric current at a higher current density than that of the initial plating period can be passed without problems.

It is possible not to pass an electric current between the cathode contact and the other divided anode(s) in the initial plating period.

The present invention provides another electroplating apparatus comprising: a substrate holder for holding a substrate; a cathode contact for contact with a conductive layer formed in a surface of the substrate, held by the substrate holder, to feed electricity to the conductive layer; and an anode disposed such that it faces the surface of the substrate held by the substrate holder. The anode includes a laminate of a plurality of insoluble anode plates, arranged at a predetermined distance from each other, each insoluble anode plate either being of a mesh-like shape or having holes throughout it. The region between the anode and the substrate held by the substrate holder is filled with a plating solution when carrying out plating of the surface of the substrate.

By using the anode comprising a laminate of a plurality of insoluble anode plates, arranged at a predetermined distance from each other, each insoluble anode plate either being of a mesh-like shape or having holes throughout it, it becomes possible to carry out plating with the electric field concentrated in the central portion of a substrate, e.g., in an initial plating period, thereby forming a plated film having a more uniform thickness on the surface of the substrate even when the substrate has a high surface sheet resistance. The use of insoluble anode plates can prevent a gradual change in their shapes with repeated plating operations and enables a complicated geometric arrangement of the plates, thus enabling effective lamination of the insoluble anode plates.

The present invention provides yet another electroplating apparatus comprising: a substrate holder for holding a substrate; a sealing member for contact with a peripheral portion of a surface of the substrate, held by the substrate holder, to seal the peripheral portion; a cathode contact for contact with a conductive layer formed in the surface of the substrate, held by the substrate holder, to feed electricity to the conductive layer; and an anode disposed such that it faces the surface of the substrate held by the substrate holder. The anode includes a laminate of a plurality of insoluble anode plates, arranged at a predetermined distance from each other, each insoluble anode plate either being of a mesh-like shape or having holes throughout it. The apparatus also includes a porous body of a water-retentive material, disposed between the anode and the substrate held by the substrate holder; and a mechanism for moving the porous body and the substrate held by the substrate holder relative to each other. The region between the anode and the substrate held by the substrate holder is filled with a plating solution when carrying out plating of the surface of the substrate.

With this structure, a plated film having a more uniform thickness can be formed on a substrate having a high sheet resistance by utilizing a synergistic effect produced by the use of the anode comprising a laminate of a plurality of insoluble anode plates, arranged at a predetermined distance from each other, each insoluble anode plate either being of a mesh-like shape or having holes throughout it, combined with the use of the porous body of a water-retentive material, disposed between the substrate held by the substrate holder and the anode.

Preferably, the insoluble anode plates are each comprised of a conductor having a surface coating of platinum or iridium oxide.

A common rectifier may be provided for the plurality of insoluble anode plates.

The rectifier and each insoluble anode plate may be connected by a conducting wire having a switch interposed therein.

This makes it possible, with a relatively simple construction, to easily control the electric field between the anode and the central or peripheral portion of the substrate which is connected to the cathode contact and serves as a cathode.

The plurality of insoluble anode plates may be electrically parallel with respect to the substrate held by the substrate holder, and the distance between the substrate and one insoluble anode plate may be different from the distance between the substrate and another insoluble anode plate.

An acid concentration of the plating solution is, e.g., not more than 40 g/L.

The present invention provides another electroplating method comprising: disposing an anode such that it faces a surface of a substrate, said anode comprising a laminate of a plurality of insoluble anode plates, arranged at a predetermined distance from each other, each insoluble anode plate either being of a mesh-like shape or having holes throughout it; filling a plating solution into the region between the substrate and the anode; and carrying out plating of the surface of the substrate by applying a voltage between the substrate and at least one insoluble anode plate of the anode.

BRIEF DESCRIPTION OF THE DRAWINGS

FIG. 19A is a graph showing the relationship between plating time and plating current, as observed when electroplating is carried out by applying a high electric current during an initial plating period in the electroplating apparatus shown in FIG. 18, and FIG. 19B is a graph showing the relationship between plating time and plating current, as observed when electroplating is carried out by not applying a high electric current during an initial plating period;

FIG. 20A is a diagram schematically showing a surface of a plated film as formed when electroplating is carried out by applying a high electric current during an initial plating period in the electroplating apparatus shown in FIG. 18, and FIG. 20B is a graph showing a surface of a plated film as formed when electroplating is carried out by not applying a high electric current during an initial plating period;

DETAILED DESCRIPTION OF THE PREFERRED EMBODIMENTS

Figure 28A:
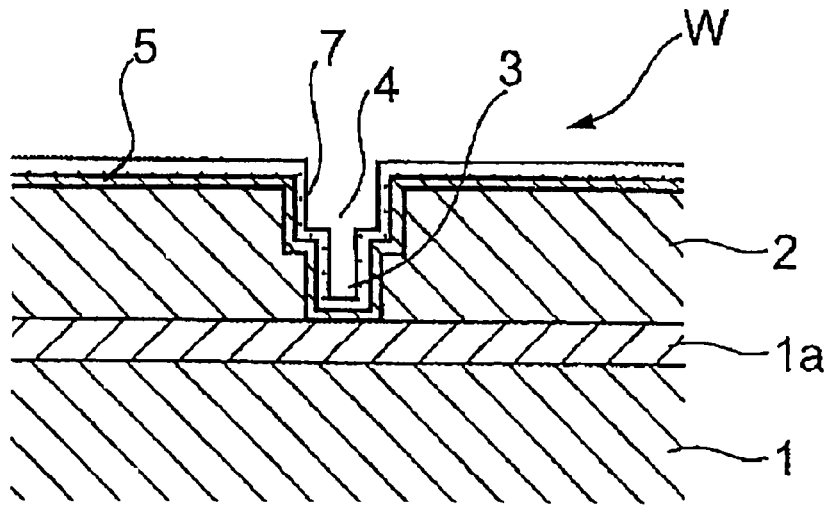
FIGS. 28A through 28C are diagrams illustrating, in a sequence of process steps, a process for forming copper interconnects by plating.
Figure 28B:
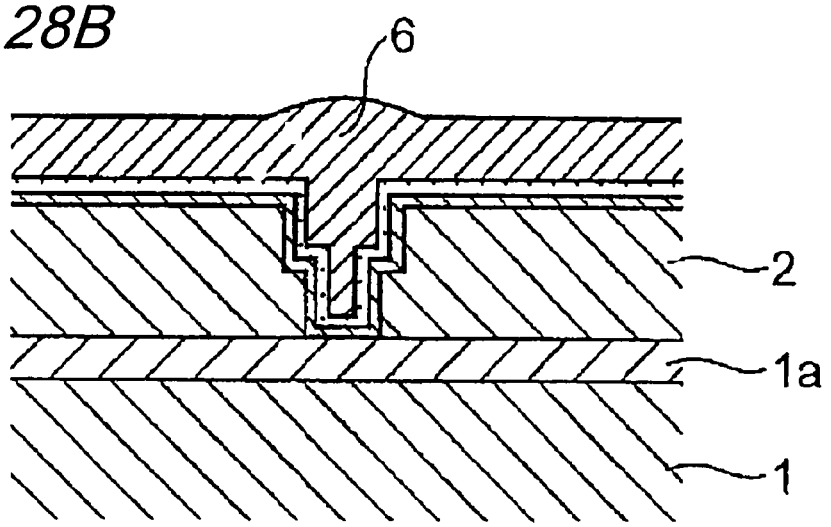
Figure 28C:
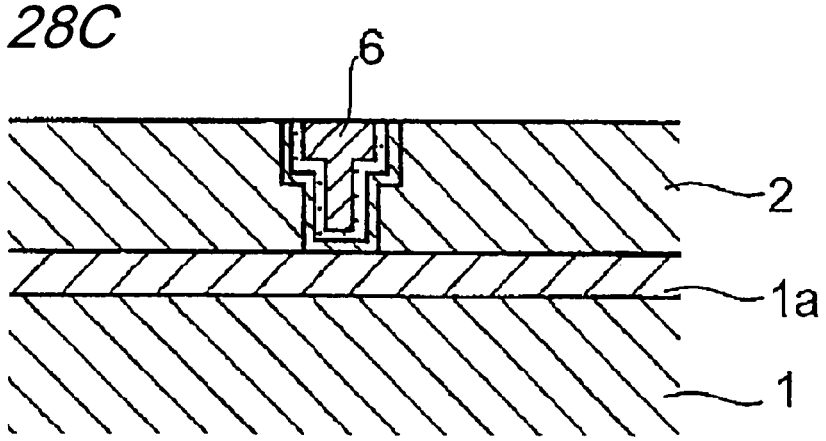
Figure 29:
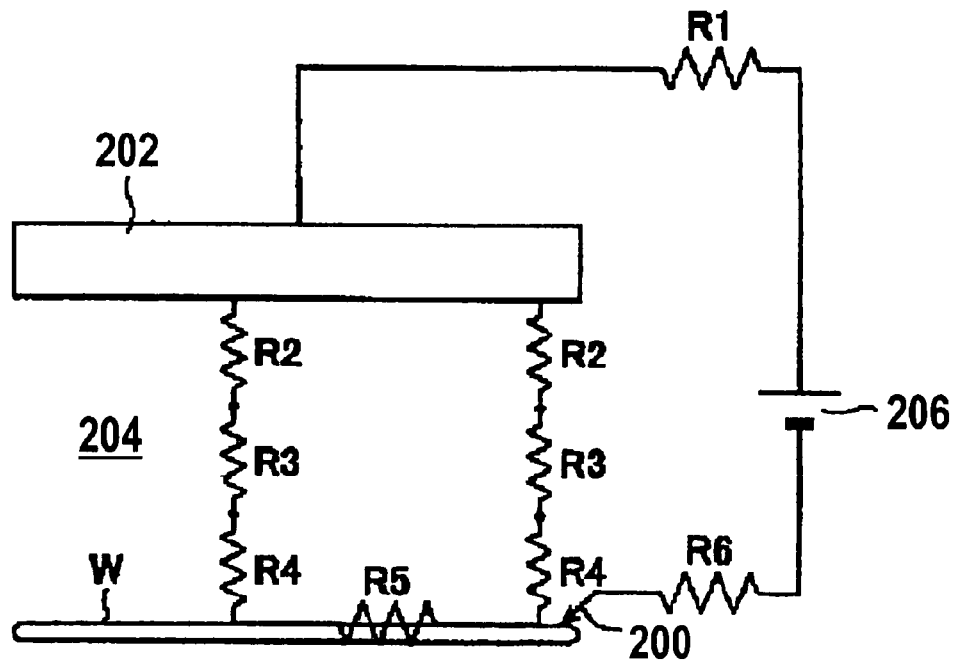
FIG. 29 is a diagram illustrating a conventional electroplating apparatus.
Figure 30:
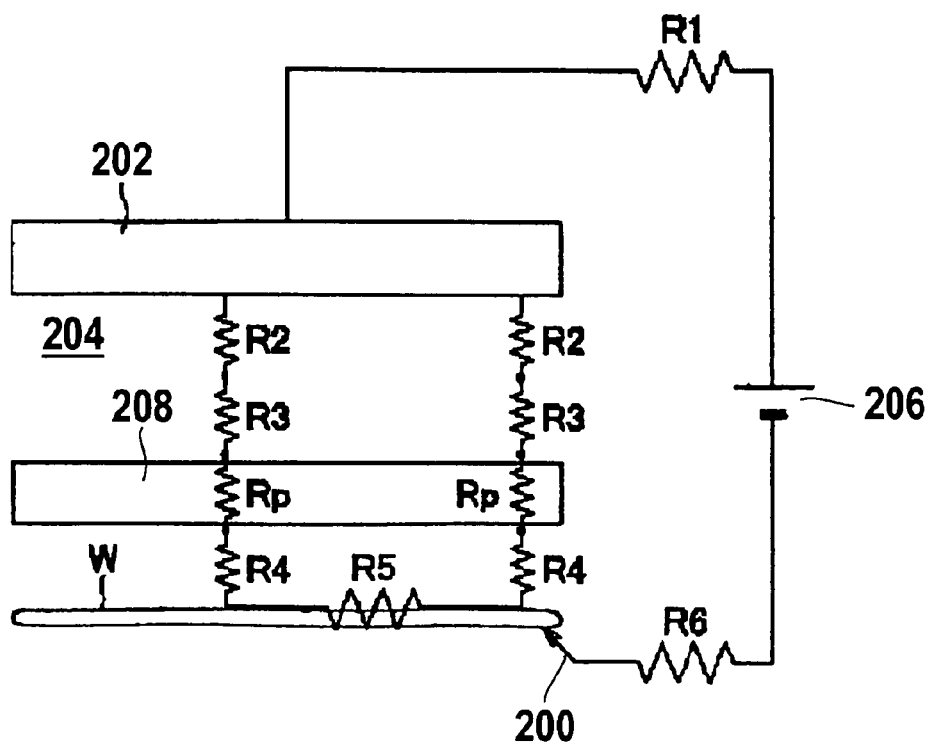
FIG. 30 is a diagram illustrating the basic construction of an electroplating apparatus for use in the present invention.

Preferred embodiments of the present invention will now be described with reference to the drawings. The following description illustrates the case of carrying out copper electroplating of a surface of a substrate, such as a semiconductor wafer, having a seed layer (conductive layer) 7 of, for example, Cu, Ru, Ta, TaN, W, WNC, WC, Pt, ITO, Ti, or TiW, the resistivity of which is equal to or higher than that of copper, to thereby fill copper into fine interconnect recesses provided in the substrate surface, and then forming interconnects of copper film 6, as shown in FIGS. 28A through 28C.

Figure 1:
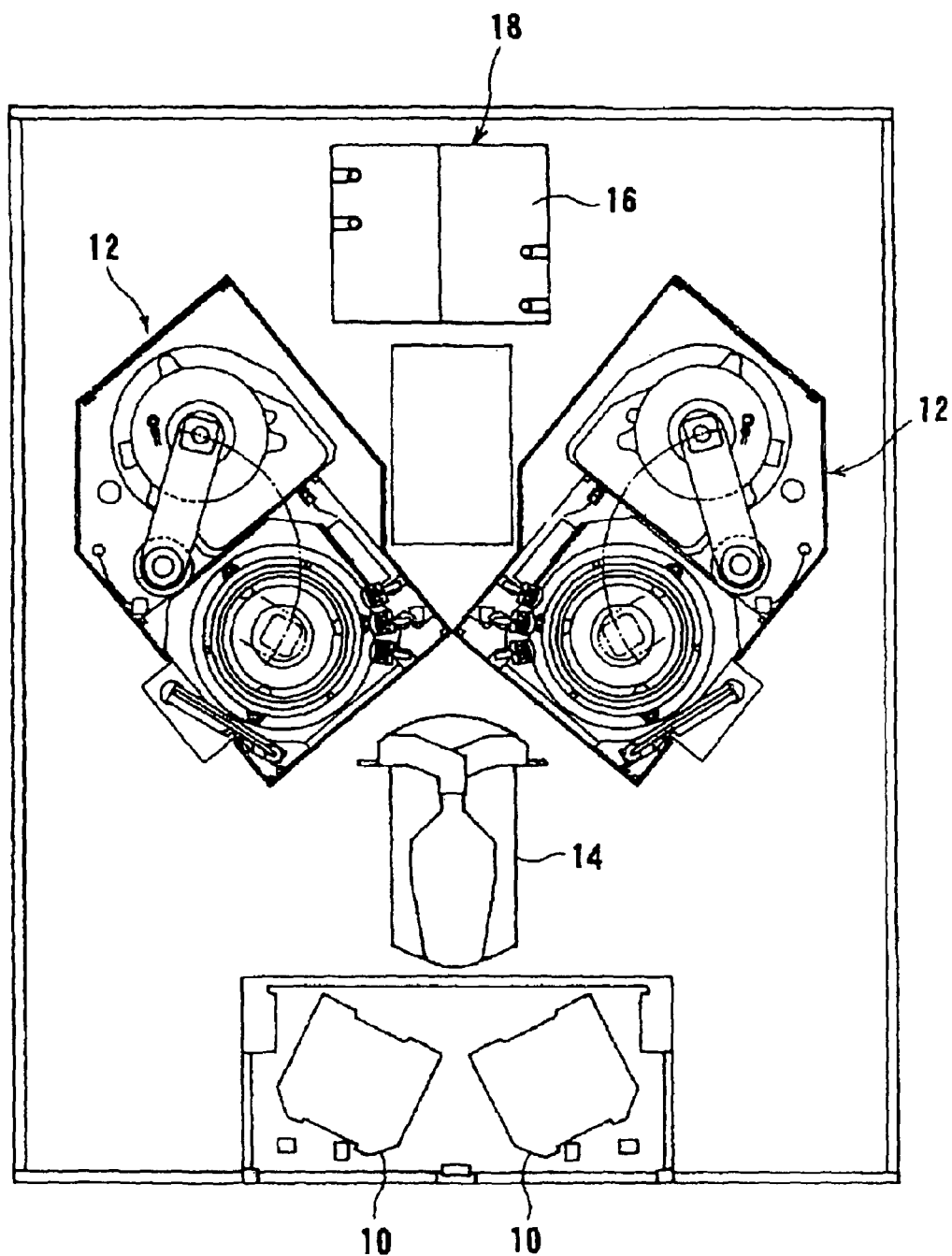
FIG. 1 is an overall plan view showing a substrate processing apparatus incorporating an electroplating apparatus according to an embodiment of the present invention.

FIG. 1 is an overall plan view showing a substrate processing apparatus incorporating an electroplating apparatus according to an embodiment of the present invention. As shown in FIG. 1, this substrate processing apparatus has a rectangular facility which houses therein two loading/unloading units 10 for housing a plurality of substrates W therein, two electroplating apparatuses 12 for performing plating process and processing incidental thereto, a transfer robot 14 for transferring substrates W between the loading/unloading units 10 and the electroplating apparatuses 12, and plating solution supply equipment 18 having a plating solution tank 16.

Figure 2:
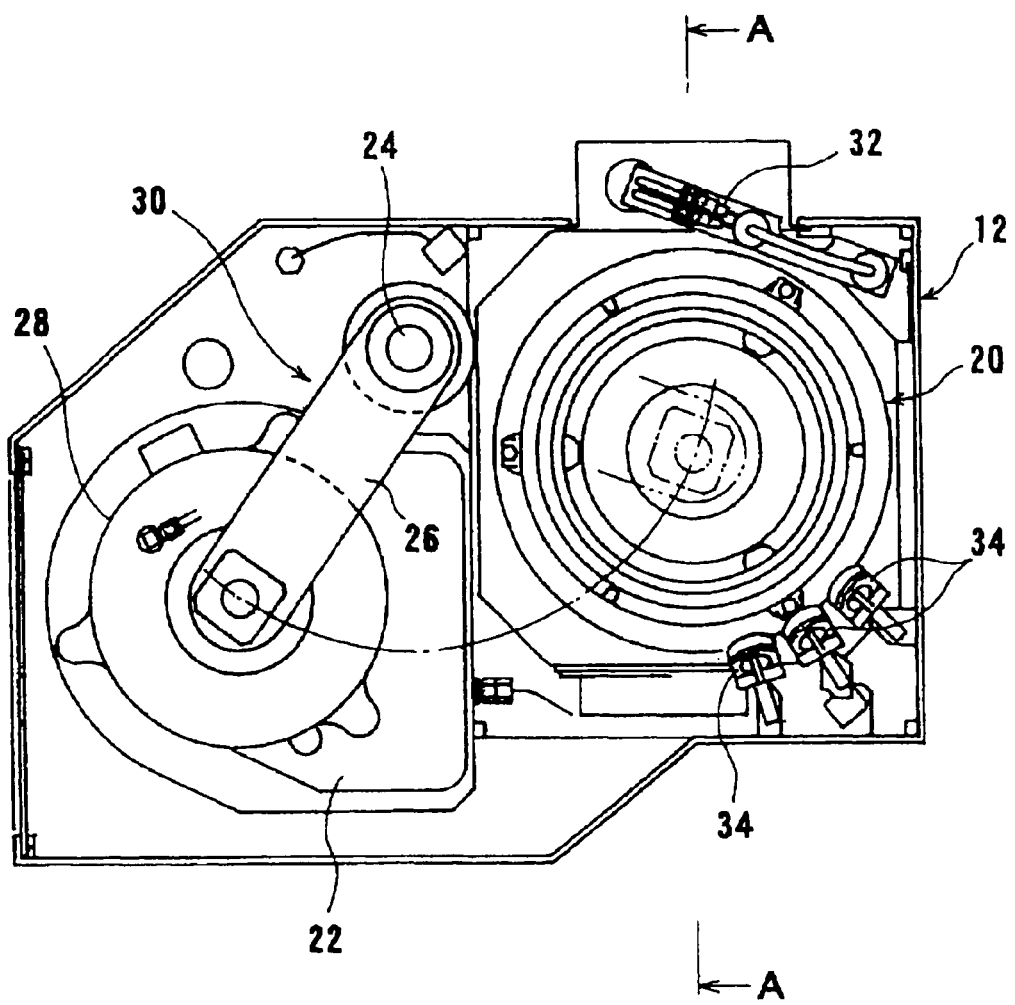
FIG. 2 is a plan view of the electroplating apparatus shown in FIG. 1.

The electroplating apparatus 12, as shown in FIG. 2, is provided with a substrate processing section 20 for performing plating process and processing incidental thereto, and a plating solution tray 22 for storing a plating solution is disposed adjacent to the substrate processing section 20. There is also provided an electrode arm section 30 having an electrode head 28 which is held at the front end of a swing arm 26 swingable about a rotating shaft 24 and which is moved between the substrate processing section 20 and the plating solution tray 22. Furthermore, a pre-coating/recovering arm 32, and fixed nozzles 34 for ejecting pure water or a chemical liquid such as ion water, or a gas or the like toward a substrate are disposed laterally of the substrate processing section 20. In this embodiment, three of the fixed nozzles 34 are disposed, and one of them is used for supplying pure water.

Figure 3:
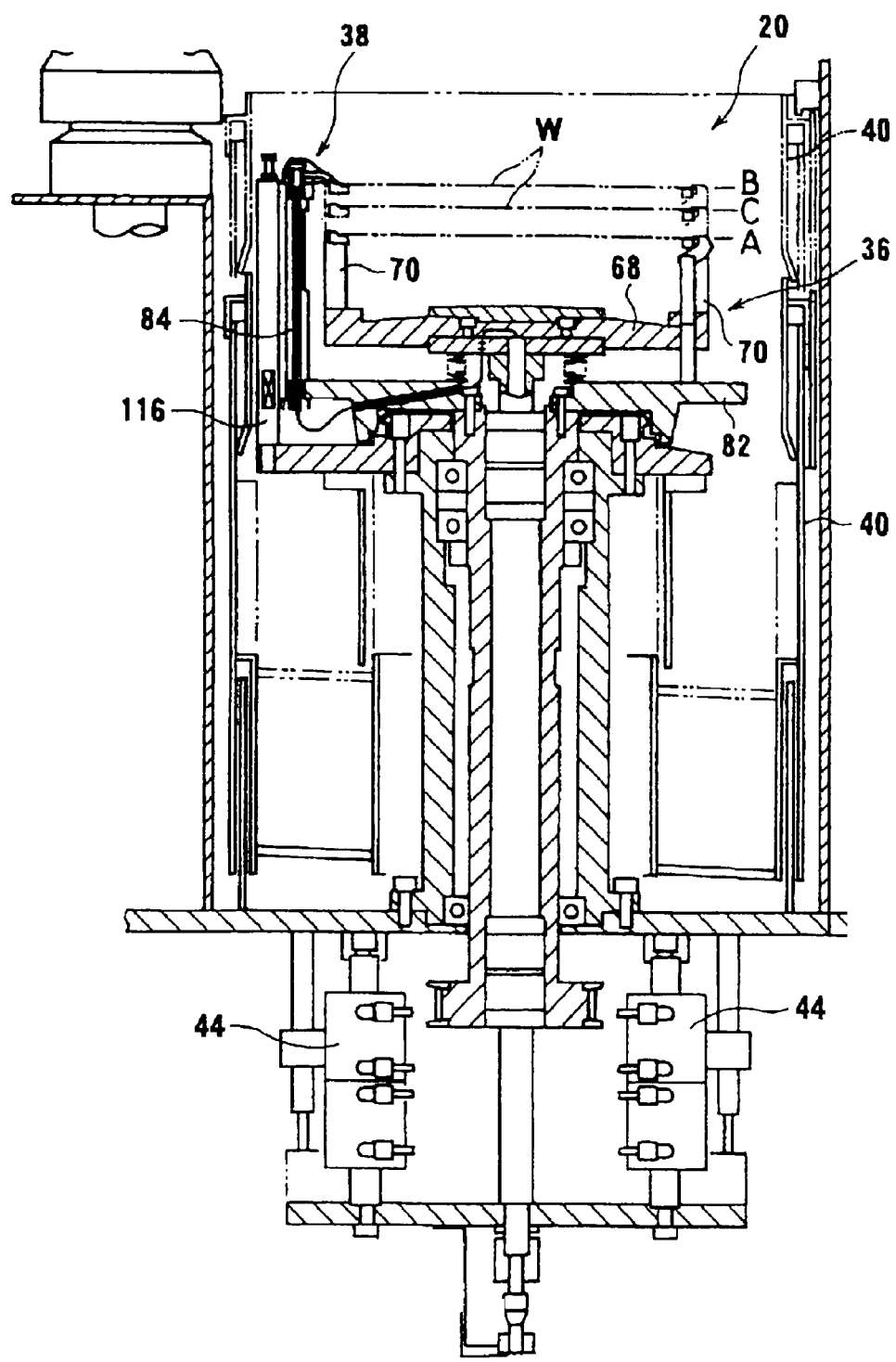
FIG. 3 is an enlarged sectional view of a substrate holder and a cathode section of the electroplating apparatus shown in FIG. 1.

The substrate processing section 20, as shown in FIG. 3, has a substrate holder 36 for holding a substrate W with its surface (surface to be plated) facing upwardly, and a cathode section 38 located above the substrate holder 36 so as to surround a peripheral portion of the substrate holder 36. Further, a substantially cylindrical bottomed splash prevention cup 40 surrounding the periphery of the substrate holder 36 for preventing scatter of various chemical liquids used during processing is provided so as to be vertically movable by an air cylinder (not shown).

The substrate holder 36 is adapted to be raised and lowered by the air cylinder 44 to and from a lower substrate transfer position A, an upper plating position B, and an intermediate pretreatment/cleaning position C that is between positions A and B. The substrate holder 36 is also adapted to rotate at an arbitrary acceleration and an arbitrary velocity, integrally with the cathode section 38 by a rotating motor and a belt (not shown). Substrate carry-in and carry-out openings (not shown) are provided in confrontation with substrate transfer position A in a side panel of the electroplating apparatus 12 facing the transfer robot 14. When the substrate holder 36 is raised to plating position B, a sealing member 90 and cathode contacts 88 (to be described below) of the cathode section 38 are brought into contact with the peripheral portion of the substrate W held by the substrate holder 36. The splash prevention cup 40 has an upper end located below the substrate carry-in and carry-out openings, and when the splash prevention cup 40 ascends, the upper end of the cup 40 reaches a position above the cathode section 38 closing the substrate carry-in and carry-out openings, as shown by imaginary lines in FIG. 3.

The plating solution tray 22 serves to wet a porous structure 110 and an anode 98 (to be described later on) of the electrode arm section 30 with a plating solution, when plating has not been performed. The plating solution tray 22 is set at a size in which the porous structure 110 can be accommodated, and the plating solution tray 22 has a plating solution supply port and a plating solution drainage port (not shown). A photosensor is attached to the plating solution tray 22, and can detect brimming with the plating solution in the plating solution tray 22, i.e., overflow, and drainage.

The electrode arm section 30 is vertically movable by a vertical movement motor (not shown), which is a servomotor, and a ball screw, and swing able to move the electrode head 28 between the plating solution tray 22 and the substrate processing section 20 by a swing motor.

Figure 4:
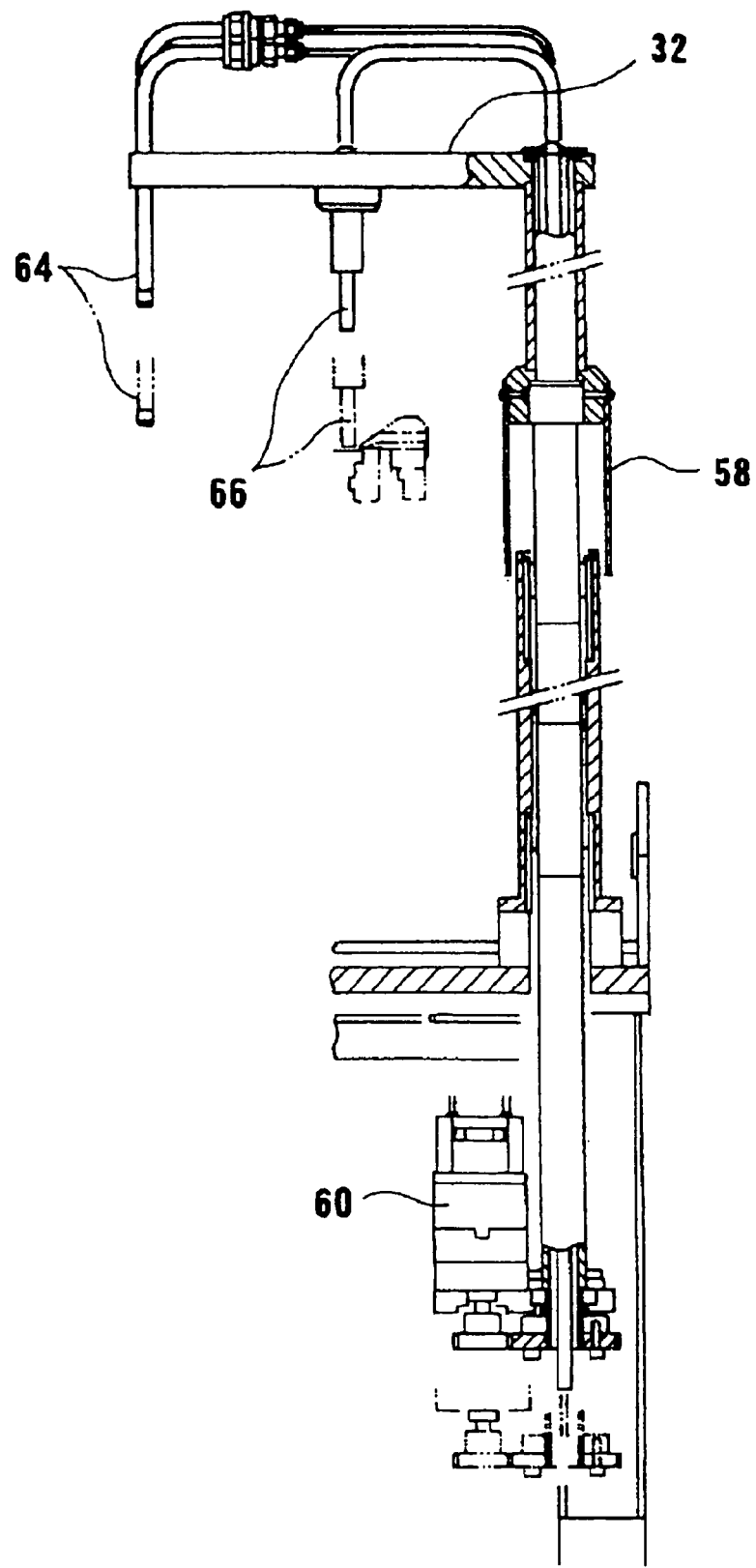
FIG. 4 is a front view sowing a pre-coating/recovery arm of the electroplating apparatus shown in FIG. 1.

As shown in FIG. 4, the pre-coating/recovering arm 32 is coupled to an upper end of a vertical support shaft 58. The pre-coating/recovering arm 32 is swing able by a rotary actuator 60 and is also vertically moveable by an air cylinder (not shown). The pre-coating/recovering arm 32 supports a pre-coating nozzle 64 for discharging a pre-coating liquid, on its free end side, and a plating solution recovering nozzle 66 for recovering the plating solution, on a portion closer to its proximal end. The pre-coating nozzle 64 is connected to a syringe that is actuatable by an air cylinder, for example, for intermittently discharging a pre-coating liquid from the pre-coating nozzle 64. The plating solution recovering nozzle 66 is connected to a cylinder pump or an aspirator, for example, to draw the plating solution on the substrate from the plating solution recovering nozzle 66.

Figure 5:
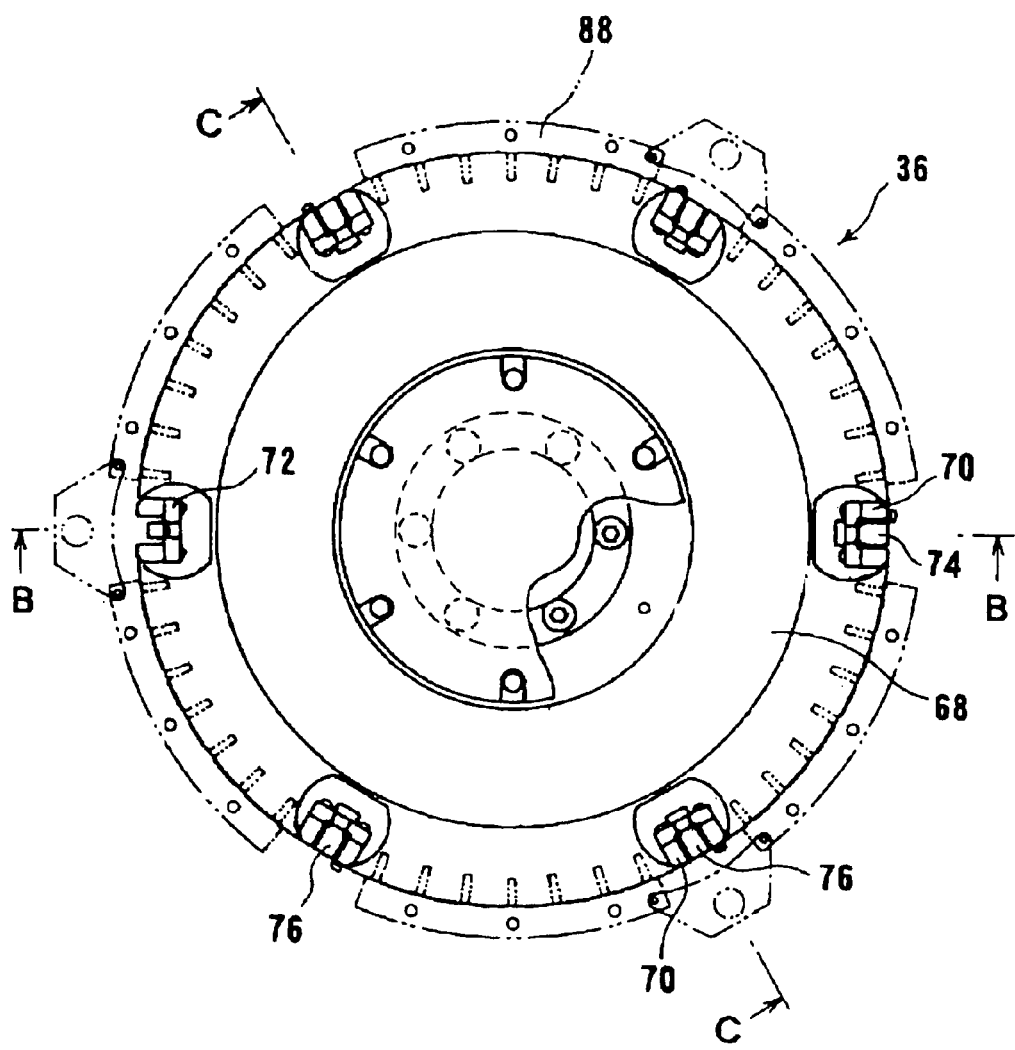
FIG. 5 is a plan view of the substrate holder of the electroplating apparatus shown in FIG. 1.
Figure 6:
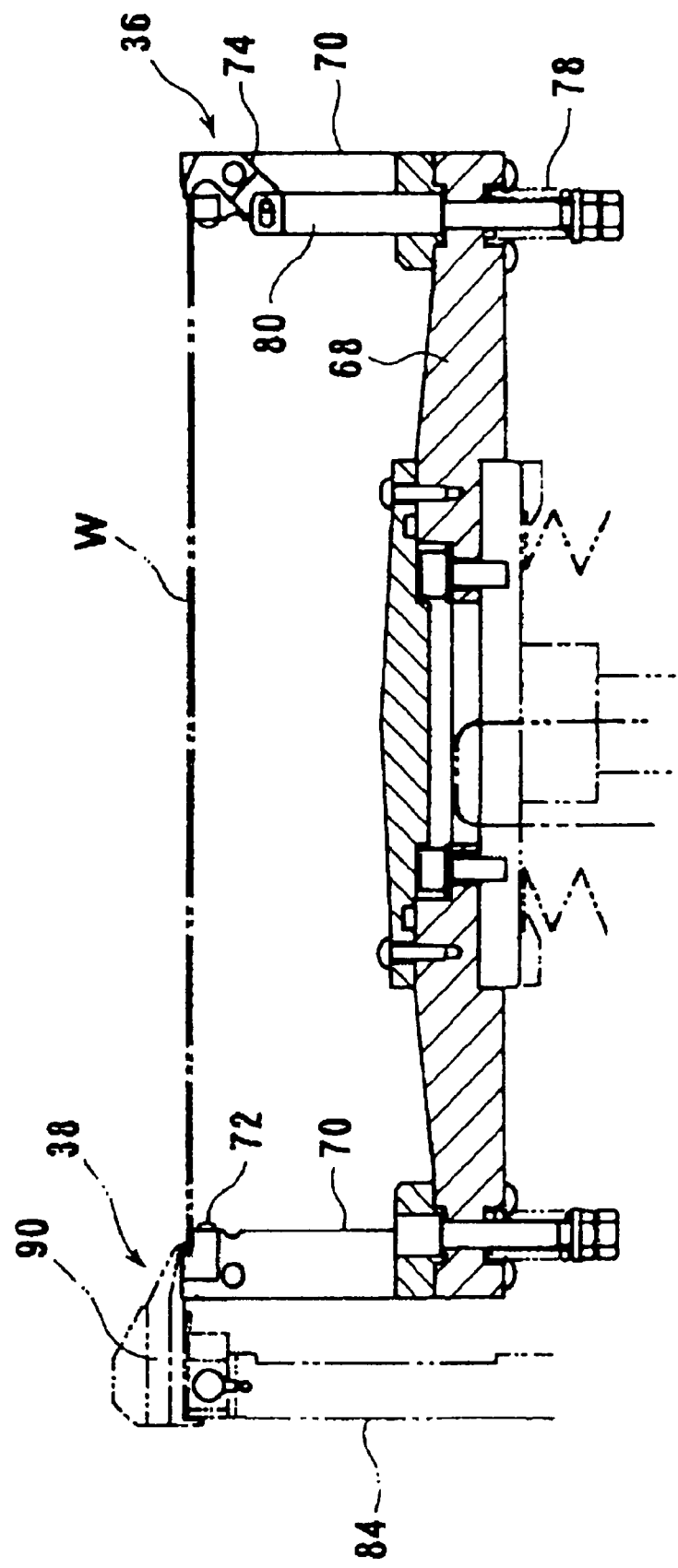
FIG. 6 is a cross-sectional diagram taken along the line B-B of FIG. 5.
Figure 7:
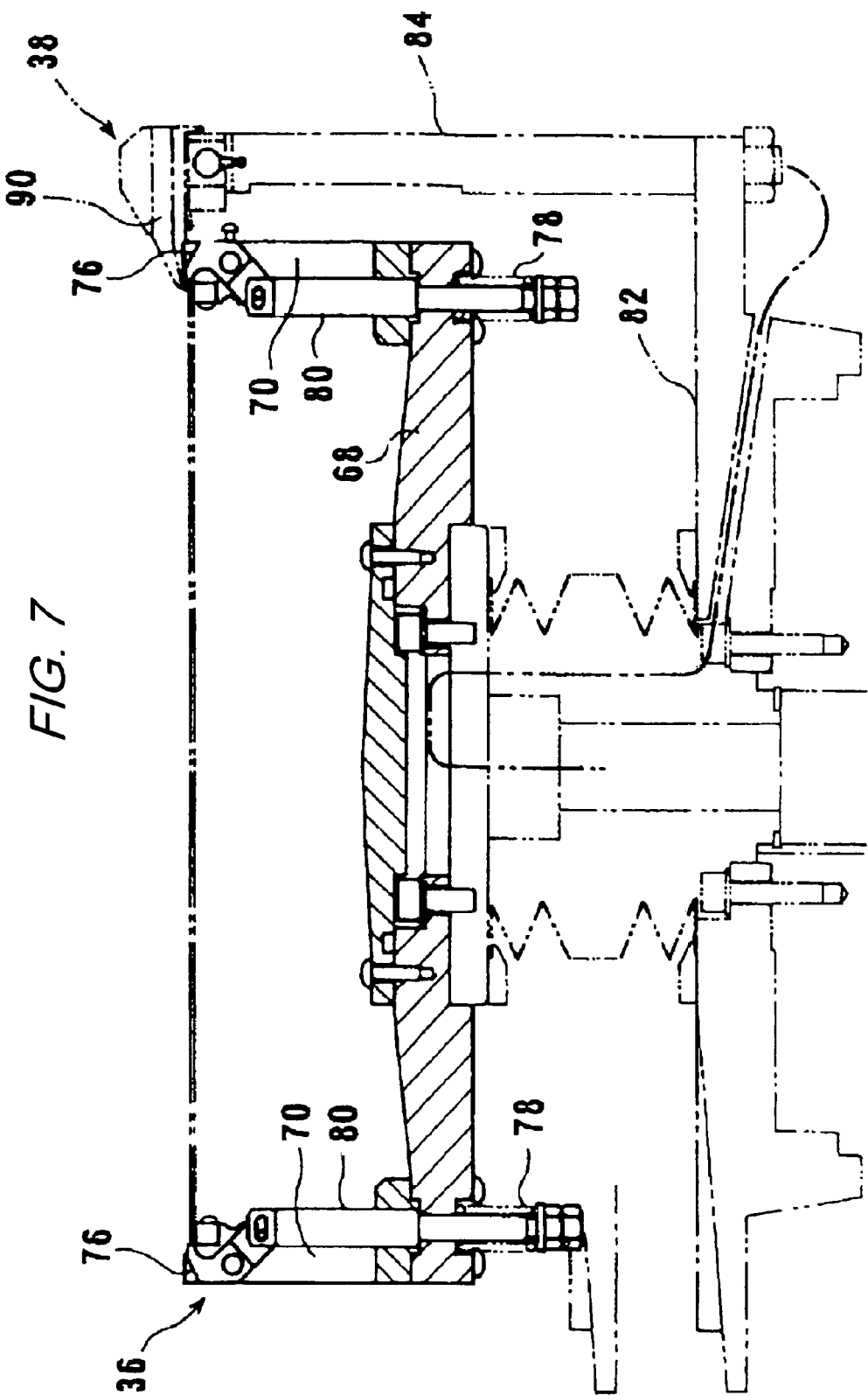
FIG. 7 is a cross-sectional diagram taken along the line C-C of FIG. 5.

As shown in FIGS. 5 through 7, the substrate holder 36 has a disk-shaped substrate stage 68 and six vertical support arms 70 disposed at spaced intervals on the circumferential edge of the substrate stage 68 for holding a substrate W in a horizontal plane on respective upper surfaces of the support arms 70. A positioning plate 72 is mounted on an upper end of one of the support arms 70 for positioning the substrate W by contacting the end face of the substrate. A pressing finger 74 is rotatably mounted on an upper end of the support arm 70, which is positioned opposite to the support arm 70 having the positioning plate 72, for abutting against an end face of the substrate W and pressing the substrate W to the positioning plate 72 when rotated. Chucking fingers 76 are rotatably mounted on upper ends of the remaining four support arms 70 for pressing the substrate W downwardly and gripping the circumferential edge of the substrate W.

The pressing finger 74 and the chucking fingers 76 have respective lower ends coupled to upper ends of pressing pins 80 that are normally urged to move downwardly by coil springs 78. When the pressing pins 80 are moved downwardly, the pressing finger 74 and the chucking fingers 76 are rotated radially inwardly into a closed position. A support plate 82 is disposed below the substrate stage 68 for engaging lower ends of the opening pins 80 and pushing them upwardly.

When the substrate holder 36 is located in substrate transfer position A shown in FIG. 3, the pressing pins 80 are engaged and pushed upwardly by the support plate 82, so that the pressing finger 74 and the chucking fingers 76 rotate outwardly and open. When the substrate stage 68 is elevated, the opening pins 80 are lowered under the resiliency of the coil springs 78, so that the pressing finger 74 and the chucking fingers 76 rotate inwardly and close.

Figure 8:
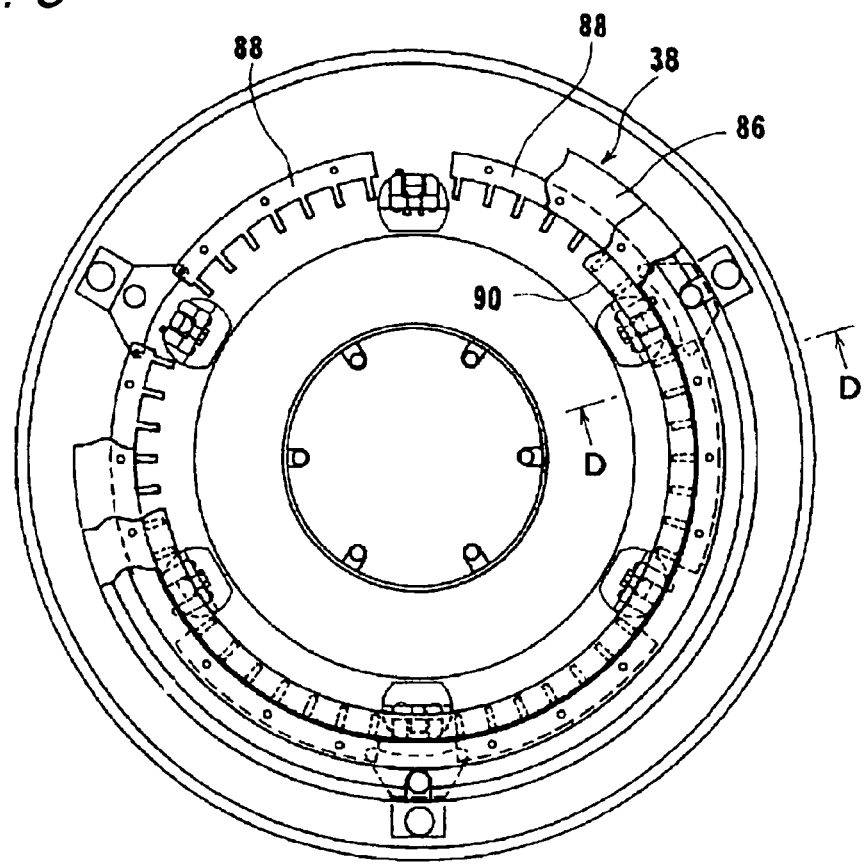
FIG. 8 is a plan view of the cathode section of the electroplating apparatus shown in FIG. 1.
Figure 9:
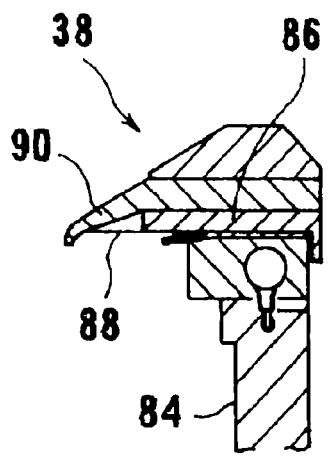
FIG. 9 is a cross-sectional diagram taken along the line D-D of FIG. 8.

As shown in FIGS. 8 and 9, the cathode section 38 comprises an annular frame 86 fixed to upper ends of vertical support columns 84 mounted on the peripheral edge of the support plate 82 (see FIG. 7), a plurality of, six in this embOdiment, cathode contacts 88 attached to a lower surface of the annular frame 86 and projecting inwardly, and an annular sealing member 90 mounted on an upper surface of the annular frame 86 in covering relation to upper surfaces of the cathode contacts 88. The sealing member 90 is adapted to have an inner peripheral edge portion inclined inwardly downwardly and progressively thin-walled, and to have an inner peripheral end suspended downwardly.

When the substrate holder 36 has ascended to plating position B, as shown FIG. 3, the cathode contacts 88 are pressed against the peripheral portion of the substrate W held by the substrate holder 36 for thereby allowing electric current to pass through the substrate W. At the same time, an inner peripheral end portion of the sealing member 90 is brought into contact with an upper surface of the peripheral portion of the substrate W under pressure to seal its contact portion in a watertight manner. As a result, the plating solution supplied onto the upper surface (surface to be plated) of the substrate W is prevented from seeping from the end portion of the substrate W, and the plating solution is prevented from contaminating the cathode contacts 88.

In the present embodiment, the cathode section 38 is vertically immovable, but rotatable in a body with the substrate holder 36. However, the cathode section 38 may be arranged such that it is vertically movable and the sealing member 90 is pressed against the surface, to be plated, of the substrate W when the cathode section 38 is lowered.

Figure 10:
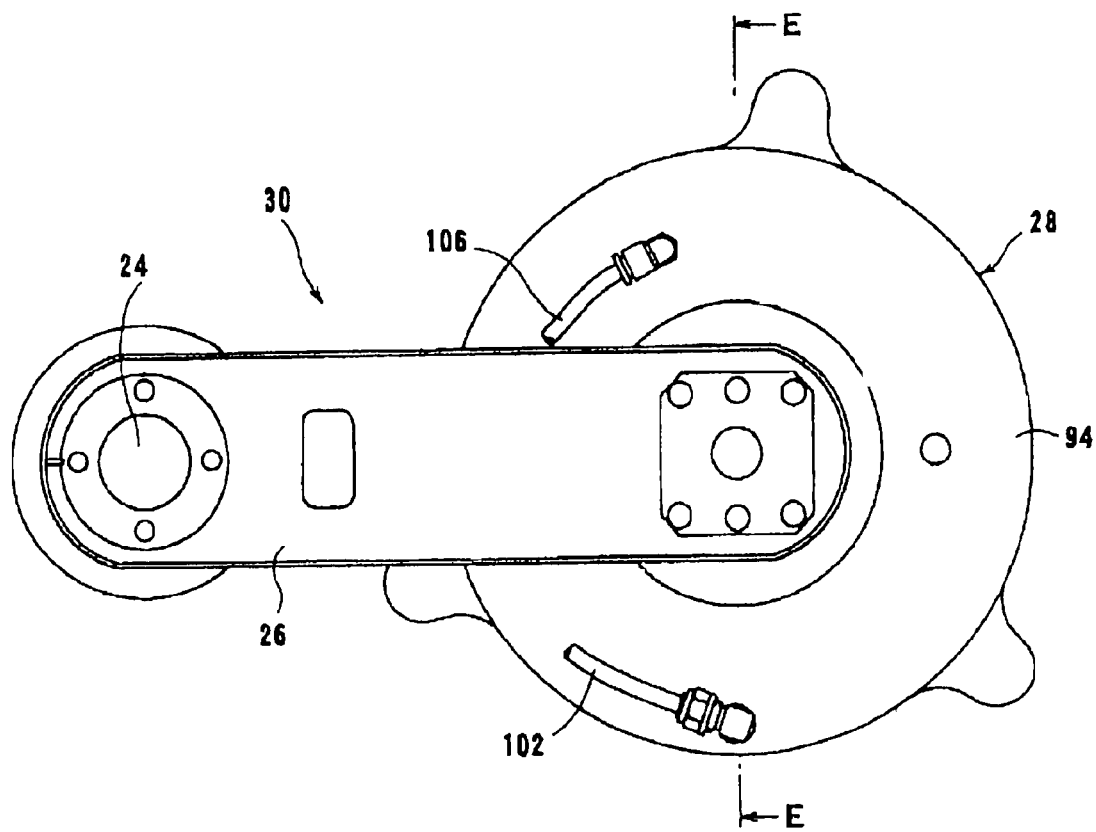
FIG. 10 is a plan view of an electrode arm section of the electroplating apparatus shown in FIG. 1.
Figure 11:
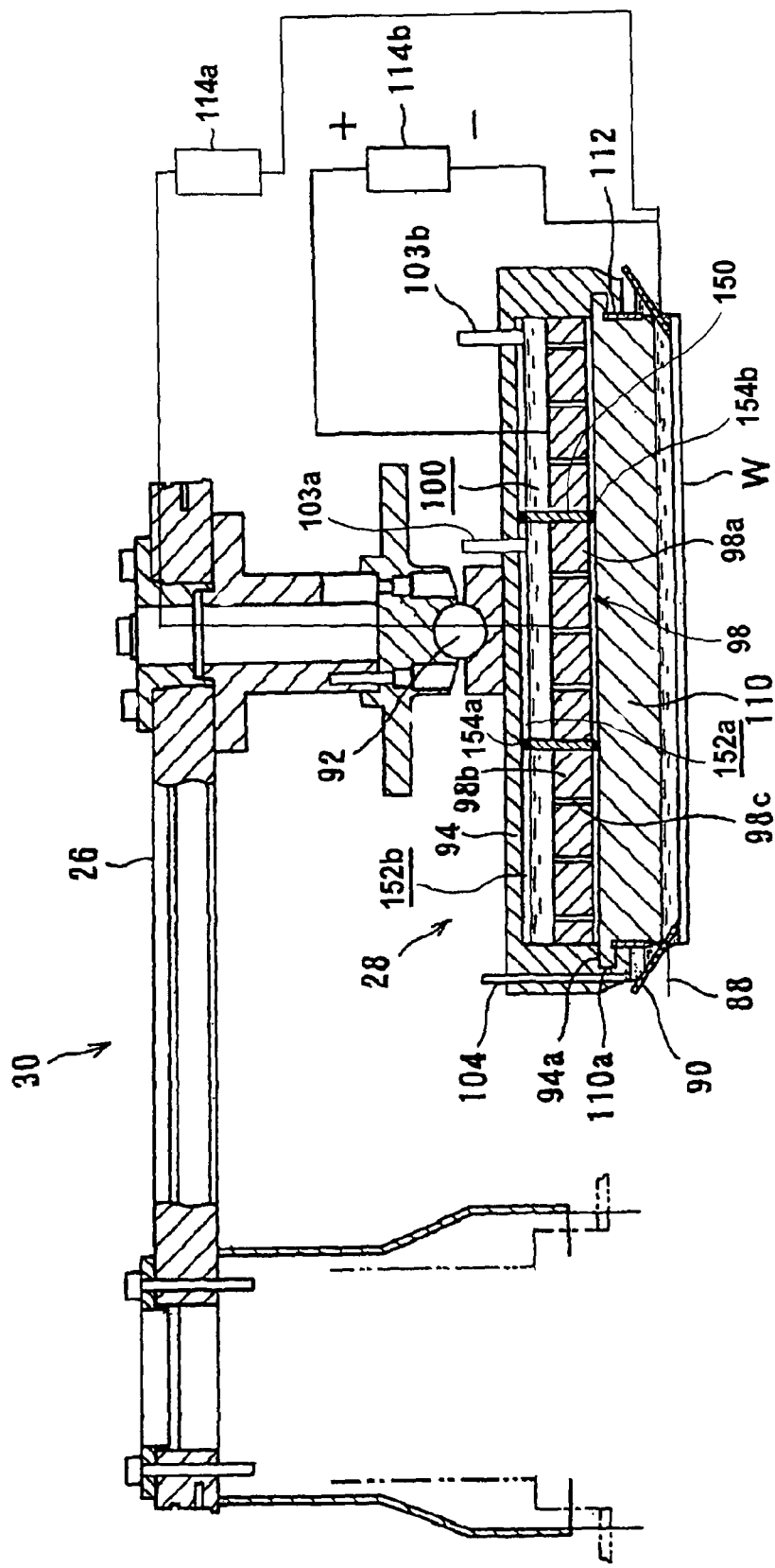
FIG. 11 is a cross-sectional diagram schematically showing an electrode head of the electroplating apparatus shown in FIG. 1 and a substrate held by the substrate holder when electroplating is performed.
Figure 12:
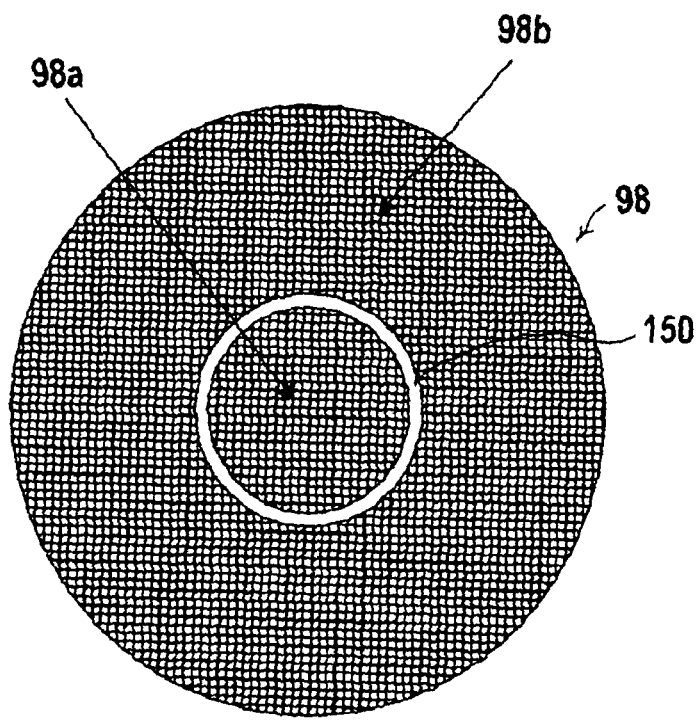
FIG. 12 is a plan view showing an anode of the electroplating apparatus shown in FIG. 1.

As shown in FIGS. 10 and 11, the electrode head 28 of the electrode arm section 30 includes a housing 94 coupled via a ball bearing 92 to the free end of the pivot arm 26, and a porous structure 110 disposed such that it closes the bottom opening of the housing 94. In particular, the housing 94 has the shape of a downwardly-open bottomed cup and has a recessed portion 94a at a lower position in the inner peripheral surface. The porous structure 110 has at its top a flange portion 110a that fits in the recessed portion 94a. The porous structure 110 is held in the housing 94 by fitting the flange portion 110a into the recessed portion 94a. A hollow plating solution chamber 100 is thus formed in the housing 94.

The plating solution chamber 100 is divided into two concentric rooms 152a, 152b by a cylindrical partition plate 150 of an insulating material. Sealing rings 154a, 154b of, e.g., rubber or Teflon (registered trademark) are interposed between the upper end face of the partition plate 150 and the lower surface of the ceiling wall of the housing 94 and between the lower end face of the partition plate 150 and the upper surface of the porous structure 110. This prevents an electric current from flowing from one (first) room 152a to the other (second) room 152b through a plating solution when the rooms 152a, 152b are filled with the plating solution, so that the rooms 152a, 152b can be electrically insulated from each other.

The porous structure 110 has a pressure loss (as measured at room temperature by passing nitrogen gas at a linear velocity of 0.01 m/s through 14 mm-thick porous structure) of not less than 500 kPa, preferably not less than 1000 kPa, more preferably not less than 1500 kPa, or an apparent porosity (in accordance with JIS R 2205) of not more than 19%, preferably not more than 15%, more preferably not more than 10%, and has a resistivity of not less than $1.0 \times 10^5$ Ω·cm. The porous structure 110 is composed of silicon carbide, silicon carbide with oxidation-treated surface, alumina, or a plastic, such as a sintered body of polypropylene or polyethylene, or a combination thereof. The thickness of the porous structure 110 is generally about 1 to 20 mm, preferably about 5 to 20 mm, more preferably about 8 to 15 mm.

The porous structure 110 used in this embodiment is composed of silicon carbide (SiC), having a pressure loss of 1500 kPa or an apparent porosity of 10% and having a resistivity of $1.0 \times 10^6$ Ω·cm. Though the porous structure 110 per se is an insulating material, it has an electric conductivity when it contains a plating solution. In particular, the plating solution penetrates the porous structure 110 in the thickness direction though complicated, fairly long paths of the pores. This can provide the porous structure 110 containing the plating solution with an electric conductivity which is lower than the electric conductivity of the plating solution.

By thus providing the porous structure 110 of, e.g., silicon carbide, having a pressure loss of not less than 500 kPa, preferably not less than 1000 kPa, more preferably not less than 1500 kPa or an apparent porosity of not more than 19%, preferably not more than 15%, more preferably not more than 10% and having a resistivity of not less than $1.0 \times 10^5$ Ω·cm, in the plating solution chamber 100, and allowing the porous structure 110 to have a high electric resistance, it becomes possible to make the influence of the electric resistance of the seed layer 7 (see FIG. 28A) of the substrate W as small as negligible even when the substrate W has a large area and the seed layer 7 that is thin and has a large electric resistance. Thus, a difference in current density in the surface of the substrate W due to the electric resistance of the substrate surface can be made small, thereby enhancing the in-plane uniformity of a plated film.

In the plating solution chamber 100 and above the porous structure 110 is disposed an anode 98 having a large number of vertical through-holes 98c. The anode 98 is comprised of two concentric divided anodes: a central disk-shaped anode 98a and a peripheral ring-shaped anode 98b. The disk-shaped anode (divided anode) 98a is disposed in the room 152a located centrally in the plating solution chamber 100, and the ring-shaped anode (divided anode) 98b is disposed in the room 152b located peripherally in the plating solution chamber 100.

Though, in this embodiment, the plating solution chamber 100 is divided into the two concentric rooms 152a, 152b, and the two concentric divided anodes 98a, 98b are disposed in the rooms 152a, 152b, respectively, it is also possible to divide the plating solution chamber 100 into three or more concentric rooms and dispose three or more concentric divided anodes respectively in the divided rooms. Further, it is also possible to divide the plating solution chamber 100 into rooms of any desired shapes and dispose divided anodes of any desired shapes respectively in the divided rooms.

The diameter of the disk-shaped anode 98a and the inner diameter of the partition plate 150 are each preferably not more than ⅔ and not less than ⅕ of the diameter of the substrate W, for example, not more than 200 mm and not less than 60 mm when forming a plated film on a surface of a wafer having a diameter of 300 mm. This prevents dispersion of the electric field and allows a specialized electric current to flow to the central portion of the substrate, facing the centrally-located disk-shaped anode 98a, thereby promoting plating in the central portion of the substrate while reducing the influence of the sheet resistance of the conductive layer (seed layer 7).

Thus, in this embodiment, the sealing ring 154b, mounted to the lower end of the partition plate 150, is in contact with the surface of the porous structure 110 along a circle having a diameter of not more than ⅔ and not less than ⅕ of the diameter of the substrate W, for example, not more than 200 mm and not less than 60 mm when forming a plated film on a surface of a wafer having a diameter of 300 mm. Of course, the inner diameter of the partition plate 150 need not necessarily be identical with the diameter of the disk-shaped anode 98a.

The distance between the divided anodes 98a, 98b and the porous structure 110 is preferably not more than 10 mm. By thus disposing the divided anodes 98a, 98b as close as possible to the porous structure 110, a specialized electric current can be easily passed to the central portion of the substrate, for example.

The housing 94 has plating solution discharge outlets 152a, 152b for discharging by suction a plating solution in the rooms 152a, 152b of the plating solution chamber 100. The plating solution discharge outlets 103a, 103b are connected to a plating solution discharge pipe 106 extending from the plating solution supply equipment 18 (see FIG. 1). Further, a plating solution injection section 104, located beside the anode 98 and the porous structure 110 and vertically penetrating the peripheral wall of the housing 94, is provided within the peripheral wall of the housing 94. In this embodiment, the plating solution injection section 104 is comprised of a tube with a nozzle-shaped lower end, and is connected to a plating solution supply pipe 102 extending from the plating solution supply equipment 18 (see FIG. 1).

When the substrate holder 36 is in plating position B (see FIG. 3), the electrode head 28 is lowered until the gap between the substrate W held by the substrate holder 36 and the porous structure 110 becomes about 0.5 to 3 mm, for example, and then the plating solution injection section 104 pours the plating solution into a region between the substrate W and the porous structure 110 from a lateral position with respect to the anode 98 and the porous structure 110. The nozzle at the lower end of the plating solution injection section 104 is open toward a region between the sealing member 90 and the porous structure 110. A shield ring 112 of rubber is mounted on the outer circumferential surface of the porous structure 110 for electrically shielding the porous structure 110.

When the plating solution is introduced, the plating solution introduced from the plating solution injection section 104 flows in one direction along the surface of the substrate W. The flow of the plating solution pushes and discharges the air out of the region between the substrate W and the porous structure 110, filling the region with the fresh plating solution whose composition has been adjusted and that is introduced from the plating solution injection section 104. The plating solution is now retained in the region defined between the substrate W and the sealing member 90.

Since the plating solution is introduced into the region between the substrate W and the porous structure 110 from laterally of the anode 98 and the porous structure 110, the plating solution is introduced over the substrate W without the provision of any parts responsible for disturbing the electric field distribution, such as an electrolytic solution supply tube made of an insulating material, within the porous structure 110. Even if the substrate has a large area, the electric field distribution over the entire surface of the substrate is made more uniform, and when the plating solution is introduced, the plating solution retained within the porous structure 110 is prevented from leaking from the porous structure 110. Therefore, the fresh plating solution whose composition has been adjusted is supplied into the region across which the substrate W held by the substrate holder 36 and the porous structure 110 face each other.

In the electroplating apparatus 12, when the plating solution is introduced, a reaction, which tends to prevent a plated film from being embedded or partially change the properties of a plated film, may occur. To prevent such a reaction, it is desirable to pour the plating solution at a linear speed in the range from 0.1 to 10 m/sec. to complete the introduction of the plating solution over a wafer having a diameter of 300 mm, for example, within 5 seconds. The plating solution injection section 104 should preferably be shaped to meet such a demand.

In order to suppress slime formation, the anode 98 is made of copper (phosphorus-containing copper) containing 0.03 to 0.05% of phosphorus. It is also possible to use an insoluble material for the anode.

In this embodiment, the disk-shaped anode (divided anode) 98a is to be electrically connected to the anode of a first plating power source 114a, while the cathode contacts 88 are to be electrically connected to the cathode of the first plating power source 114a. The ring-shaped anode (divided anode) 98b is to be electrically connected to the anode of a second plating power source 114b, while the cathode contacts 88 are to be electrically connected to the cathode of the second plating power source 114b. Accordingly, an electric current flowing between the disk-shaped anode 98a and the cathode contacts 88, i.e., flowing in the central portion of the seed layer (conductive layer) 7 (see FIG. 28A) formed in the surface of the substrate W, and an electric current flowing between the ring-shaped anode 98b and the cathode contacts 88, i.e., flowing in the peripheral portion of the seed layer (conductive layer) 7 (see FIG. 28A) formed in the surface of the substrate W), can be adjusted independently.

It is also possible, with the use of a common plating power source, to independently adjust an electric current flowing between the disk-shaped anode 98 and the cathode contacts 88 and an electric current flowing between the ring-shaped anode 98 and the cathode contacts 88.

When the substrate holder 36 is in plating position B (see FIG. 3), the electrode head 28 is lowered until the gap between the substrate W held by the substrate holder 36 and the porous structure 110 becomes, e.g., about 0.5 to 3 mm. A plating solution is then injected from the plating solution injection section 104 into the region between the substrate W and the porous structure 110 to fill the region with the plating solution. The plating solution is stored in the region defined by the substrate W and the sealing member 90 when the plating process is performed.

Next, the operation of the substrate processing apparatus incorporating the electroplating apparatus 12 of this embodiment will now be described.

First, a substrate W to be plated is taken out from one of the loading/unloading units 10 by the transfer robot 14, and transferred, with a surface to be plated facing upwardly, through the substrate carry-in and carry-out opening defined in the side panel, into one of the electroplating apparatuses 12. At this time, the substrate holder 36 is in lower substrate transfer position A. After the hand of the transfer robot 14 has reached a position directly above the substrate stage 68, the hand of the transfer robot 14 is lowered to place the substrate W on the support arms 70. The hand of the transfer robot 14 is then retracted through the substrate carry-in and carry-out opening.

After the hand of the transfer robot 14 is retracted, the splash prevention cup 40 is elevated. Then, the substrate holder 36 is lifted from substrate transfer position A to pretreatment/cleaning position C. As the substrate holder 36 ascends, the substrate W placed on the support arms 70 is positioned by the positioning plate 72 and the pressing finger 74 and then reliably gripped by the fixing fingers 76.

On the other hand, the electrode head 28 of the electrode arm section 30 is in a normal position over the plating solution tray 22 now, and the porous structure 110 or the anode 98 is positioned in the plating solution tray 22. At the same time that the splash prevention cup 40 ascends, the plating solution starts being supplied to the plating solution tray 22 and the electrode head 28. Until the step of plating the substrate W is initiated, the new plating solution is supplied, and the plating solution discharge pipe 106 is evacuated to replace the plating solution in the porous structure 110 and remove air bubbles from the plating solution in the porous structure 110. When the ascending movement of the splash prevention cup 40 is completed, the substrate carry-in and carry-out openings in the side panel is closed by the splash prevention cup 40, isolating the atmosphere in the side panel and the atmosphere outside of the side panel from each other.

When the splash prevention cup 40 is elevated, the precoating step is initiated. Specifically, the substrate holder 36 that has received the substrate W is rotated, and the precoating/recovering arm 32 is moved from the retracted position to a position confronting the substrate W. When the rotational speed of the substrate holder 36 reaches a preset value, the pre-coating nozzle 64 mounted on the tip end of the pre-coating/recovering arm 32 intermittently discharges a pre-coating liquid which comprises a surface active agent, for example, toward the surface (surface to be plated) of the substrate W. At this time, since the substrate holder 36 is rotating, the pre-coating liquid spreads all over the surface of the substrate W. Then, the pre-coating/recovering arm 32 is returned to the retracted position, and the rotational speed of the substrate holder 36 is increased to spin the pre-coating liquid off and dry the surface to be plated of the substrate W.

After the completion of the pre-coating step, the plating step is initiated. First, the substrate holder 36 is stopped against rotation, or the rotational speed thereof is reduced to a preset rotational speed for plating. In this state, the substrate holder 36 is lifted to plating position B. Then, the peripheral portion of the substrate W is brought into contact with the cathode contacts 88, when it is possible to pass an electric current, and at the same time, the sealing member 90 is pressed against the upper surface of the peripheral portion of the substrate W, thus sealing the peripheral portion of the substrate W in a watertight manner.

Based on a signal indicating that the pre-coating step for the loaded substrate W is completed, on the other hand, the electrode arm section 30 is swung in a horizontal direction to displace the electrode head 28 from a position over the plating solution tray 22 to a position over the plating position. After the electrode head 28 reaches this position, the electrode head 28 is lowered toward the cathode section 38. At this time, the porous structure 110 does not contact with the surface of the substrate W, but is held closely to the surface of the substrate W at a distance ranging from 0.5 mm to 3 mm. The plating solution is supplied from the plating solution injection section 104 to the region between the substrate W and the porous structure 110 to fill the region with the plating solution.

Figure 13A:
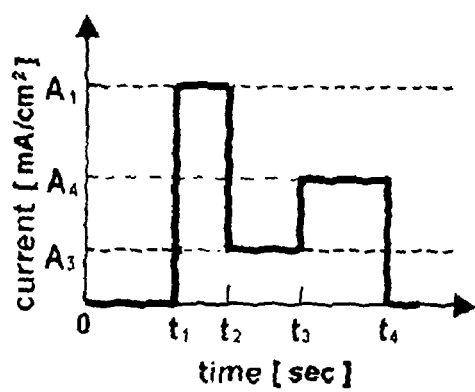
FIG. 13A is a graph showing a relationship between plating time and plating current applied between cathode contacts and a disk-shaped anode in the electroplating apparatus shown in FIG. 1.
Figure 13B:
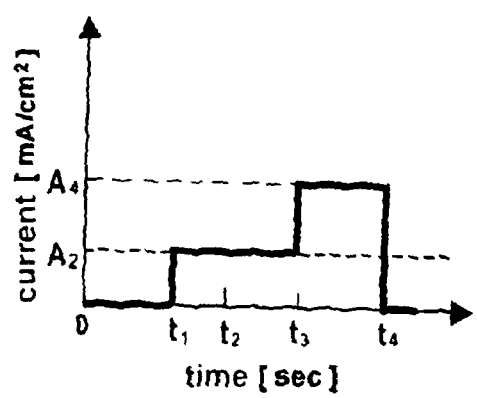
FIG. 13B is a graph showing a relationship between plating time and plating current applied between the cathode contacts and a ring-shaped anode.

During an initial plating period ($t_1$-$t_2$), a first electric current, which will provide an average cathode current density of $A_1$ for the conductive layer (seed layer 7) in the central portion of the substrate, is passed from the plating power source 114a to between the cathode contacts 88 and the centrally-located disk-shaped anode 98a, as shown in FIG. 13A, while a first electric current, which will provide an average cathode current density of $A_2$ for the conductive layer (seed layer 7) in the peripheral portion of the substrate, is passed from the plating power source 114b to between the cathode contacts 88 and the peripherally-located ring-shaped anode 98b, as shown in FIG. 13B. The average cathode current density $A_1$ in the central portion of the substrate is made higher than the average cathode current density $A_2$ in the peripheral portion of the substrate ($A_1$>$A_2$).

The above manner of initial plating prevents concentration of electric current in the peripheral portion of the substrate and allows passage of electric current to the central portion of the substrate. This can decrease the in-plane difference in current density due to the sheet resistance of the substrate surface even when the substrate has a high sheet resistance, ensuring the formation of a plated film having a more uniform thickness. Furthermore, the partition plate 150 is provided between the divided anodes 98a, 98b, and the sealing rings 154a, 154b of, e.g., rubber or Teflon ™ are interposed between the upper end face of the partition plate 150 and the lower surface of the ceiling wall of the housing 94 and between the lower end face of the partition plate 150 and the upper surface of the porous structure 110. This can prevent the respective electric fields of the divided anodes 98a, 98b from interfering with each other, thus preventing a decrease in the effect of the use of the divided anodes 98a, 98b.

During an intermediate plating period ($t_2$-$t_3$), a second electric current, which will provide an average cathode current density of $A_3$ (=$A_2$) for the conductive layer (seed layer 7) in the central portion of the substrate, is passed from the plating power source 114a to between the cathode contacts 88 and the centrally-located disk-shaped anode 98a, as shown in FIG. 13A, while a second electric current, which will continue to provide an average cathode current density of $A_2$ for the conductive layer (seed layer 7) in the peripheral portion of the substrate, is passed from the plating power source 114b to between the cathode contacts 88 and the peripherally-located ring-shaped anode 98b, as shown in FIG. 13B. The intermediate plating allows the plated film to grow at a substantially uniform plating rate over the entire surface of the substrate.

During a later plating period ($t_3$-$t_4$), third electric currents, which are each higher than the second electric current and will both provide an average cathode current density of $A_4$ (>$A_2$=$A_3$) for the conductive layer (seed layer 7), are passed from the plating power sources 114a, 114b to between the cathode contacts 88 and the centrally-located disk-shaped anode 98a and between the cathode contacts 88 and the peripherally-located ring-shaped anode 98b, as shown in FIGS. 13A and 13B. The later plating allows the plated film to grow at a substantially uniform and higher plating rate over the entire surface of the substrate.

Figure 14:
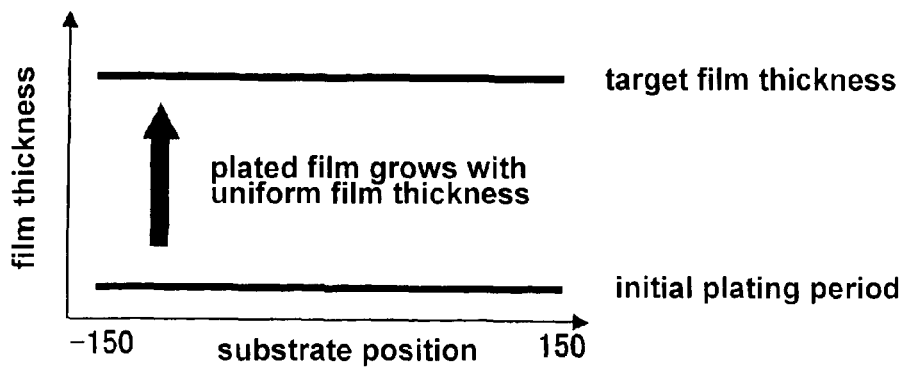
FIG. 14 is a graph schematically illustrating the growth of a plated film as observed when the plating current shown in FIGS. 13A and 13B is applied.

Thus, as shown in FIG. 14, a plated film having a uniform thickness can be formed on the surface of the substrate in the initial plating period and, in the intermediate and later plating periods, the plated film is allowed to grow at a uniform plating rate while maintaining the uniformity of the film thickness, whereby a plated film having an even surface and an intended thickness can be obtained.

It is preferred to pass a high first electric current, which will provide an average cathode current density $A_1$ of not less than 40 mA/cm$^2$ and not more than 60 mA/cm$^2$ (60>$A_1$>40 (mA/cm$^2$)) for the conductive layer (seed layer 7) in the central portion of the substrate, between the cathode contacts 88 and the centrally-located disk-shaped anode 98a during the initial plating period ($t_1$-$t_2$), and to pass a second electric current, which is lower than the first electric current and will provide an average cathode current density $A_3$ of not more than 40 mA/cm$^2$, for example 10 mA/cm$^2$ ($A_3$=10 mA/cm$^2$), for the conductive layer (seed layer 7) in the central portion of the substrate during the intermediate plating period ($t_2$-$t_3$).

This can form a glossy, good-quality plated film, which is composed of fine crystal grains even in the center of the substrate which is distant from the cathode contacts 88, over the entire surface of the substrate. An electric current at a higher current density than that of the initial plating period can be passed without problems during the later plating period ($t_3$-$t_4$).

The initial plating period ($t_1$-$t_2$) is, for example, within 5000 msec, preferably from 0 to 3000 msec, after the initiation of plating. By thus permitting broadness for the initial plating period, good embedding can be performed for a variety of fine electrical circuit patterns. It is possible to pass an electric current, which provides an average cathode current density of not less than 40 mA/cm$^2$ and not more than 60 mA/cm$^2$ for the conductive layer of the substrate, a plurality of times within 5000 msec, preferably from 0 to 3000 msec, after the initiation of plating.

Though the so-called cold entry is employed in this embodiment, that is, plating is initiated by applying a voltage between the cathode contacts 88 and the anode 98 after injecting a plating solution into the region between the substrate W and the porous structure 110 and filling the region with the plating solution, it is also possible to employ the so-called hot entry, that is, to initiate plating by injecting a plating solution into the region between the substrate W and the porous structure 110 while applying a voltage between the cathode contacts 88 and the anode 98. It is also possible not to pass an electric current between the cathode contacts 88 and the peripherally-located ring-shaped anode (divided anode) 98b during the initial plating period.

When plating is completed, the electrode arm section 30 is raised and then swung to return to the position above the plating solution tray 22 and to lower to the ordinary position. Then, the pre-coating/recovering arm 32 is moved from the retreat position to the position confronting to the substrate W, and lowered to recover the remainder of the plating solution on the substrate W by the plating solution recovering nozzle 66. After recovering of the remainder of the plating solution is completed, the pre-coating/recovering arm 32 is returned to the retreat position, and pure water is supplied from the fix nozzle 34 for supplying pure water toward the central portion of the substrate W for rinsing the plated surface of the substrate. At the same time, the substrate holder 36 is rotated at an increased speed to replace the plating solution on the surface of the substrate W with pure water. Rinsing the substrate W in this manner prevents the splashing plating solution from contaminating the cathode contacts 88 of the cathode section 38 during descent of the substrate holder 36 from plating position B.

After completion of the rinsing, the washing with water step is initiated. That is, the substrate holder 36 is lowered from plating position B to pretreatment/cleaning position C. Then, while pure water is supplied from the fixed nozzle 34 for supplying pure water, the substrate holder 36 and the cathode section 38 are rotated to perform washing with water. At this time, the sealing member 90 and the cathode contacts 88 can also be cleaned, simultaneously with the substrate W, by pure water directly supplied to the cathode section 38, or pure water scattered from the surface of the substrate W.

After washing with water is completed, the drying step is initiated. That is, supply of pure water from the fixed nozzle 34 is stopped, and the rotational speed of the substrate holder 36 and the cathode section 38 is further increased to remove pure water on the surface of the substrate W by centrifugal force and to dry the surface of the substrate W. The sealing member 90 and the cathode contacts 88 are also dried at the same time. Upon completion of the drying, the rotation of the substrate holder 36 and the cathode section 38 is stopped, and the substrate holder 36 is then lowered to substrate transfer position A. Thus, the gripping of the substrate W by the fixing fingers 76 is released, and the substrate W is just placed on the upper surfaces of the support arms 70. At the same time, the splash prevention cup 40 is also lowered.

All the steps including the plating step, the pretreatment step accompanying to the plating step, the cleaning step, and the drying step are now finished. The transfer robot 14 inserts its hand through the substrate carry-in and carry-out opening into the position beneath the substrate W, and raises the hand to receive the processed substrate W from the substrate holder 36. Then, the transfer robot 14 returns the processed substrate W received from the substrate holder 36 to the loading/unloading units 10.

Though the porous structure 110 used in this embodiment has a pressure loss of 1500 kPa or an apparent porosity of 10% and has a resistivity of $1.0 \times 10^6$ Ω·cm, and is composed of silicon carbide, it is also possible to use a porous structure composed of, e.g., silicon carbide, having an adjusted pressure loss of not less than 500 kPa, preferably not less than 1000 kP, more preferably not less than 1500 kPa, or an adjusted apparent porosity of not more than 19%, preferably not more than 15%, more preferably not more than 10%, and preferably having an adjusted resistivity of not less than $1.0 \times 10^5$ Ω·cm, or a porous structure of which at least one of the bulk specific gravity and the water absorption is adjusted, in carrying out plating of a substrate by applying a voltage between the cathode contacts 88 and the anode 98. The use of such a porous structure makes it possible to carry out electrolytic processing, such as electroplating, of a substrate with the electric field at the substrate surface adjusted to the desired state so that the substrate after electrolytic processing can have a processed surface in the intended state.

It is also possible to use a porous structure 110 whose overall electric resistance A (Ω), i.e., the resistance between the upper and lower surfaces of the porous structure 110 with its interior filled with a plating solution (electrolytic solution), is adjusted to not less than 0.02 time the sheet resistance (electric resistance) B (Ω/□) of the surface seed layer (conductive layer) 7 of the substrate W (A/B≧0.02).

Figure 15A:
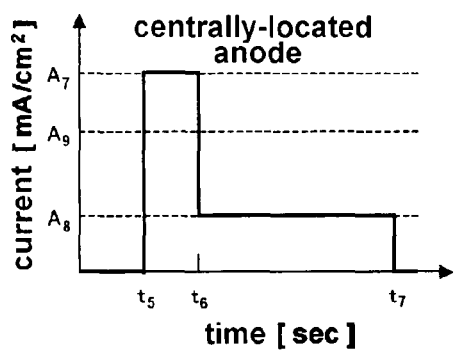
FIG. 15A is a graph showing another relationship between plating time and plating current applied between the cathode contacts and the disk-shaped anode in the electroplating apparatus shown in FIG. 1.
Figure 15B:
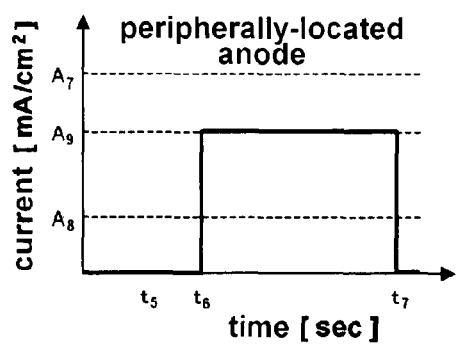
FIG. 15B is a graph showing another relationship between plating time and plating current applied between the cathode contacts and the ring-shaped anode.

FIGS. 15A and 15B are graphs showing other relationships between plating time and plating current applied between the cathode contacts 88 and the anode 98.

In particular, during an initial plating period ($t_5$-$t_6$), a first electric current, which will provide an average cathode current density of $A_7$ for the conductive layer (seed layer 7) in the central portion of the substrate, is passed from the plating power source 114a to between the cathode contacts 88 and the centrally-located disk-shaped anode 98a, as shown in FIG. 15A, while no electric current is passed between the cathode contacts 88 and the peripherally-located ring-shaped anode 98b, as shown in FIG. 15B.

During an intermediate to later plating period (t6-t7), a second electric current, which is lower than the first electric current and will provide an average cathode current density of $A_8$ ($<A_7$) for the conductive layer (seed layer 7) in the central portion of the substrate, is passed from the plating power source 114a to between the cathode contacts 88 and the centrally-located disk-shaped anode 98a, as shown in FIG. 15A. At the same time, as shown in FIG. 15B, an electric current, which is lower than the first electric current applied between the cathode contacts 88 and the centrally-located disk-shaped anode 98a in the initial plating period ($t_5$-$t_6$) and higher than the second electric current applied between the cathode contacts 88 and the centrally-located disk-shaped anode 98a in the intermediate to later plating period ($T_6$-$T_7$), and which will provide an average cathode current density of $A_9$ ($A_8<_9<A_7$) for the conductive layer (seed layer 7) in the peripheral portion of the substrate, is passed from the plating power source 114b to between the cathode contacts 88 and the peripherally-located ring-shaped anode 98b.

According to this manner of electroplating, a plated film can be formed in the central portion of the substrate in the initial plating period while best suppressing the formation of a plated film in the peripheral portion of the substrate and, in the intermediate to later plating period, the plated film is allowed to grow at a uniform plating rate over the central and peripheral portions of the substrate. A plated film with enhanced in-plane uniformity can thus be finally formed.

As with the precedent embodiment, it is preferred to pass a high first electric current, which will provide an average cathode current density $A_7$ of not less than 40 mA/cm$^2$ and not more than 60 mA/cm$^2$ ($60>A_7>40$ (mA/cm$^2$)) for the conductive layer (seed layer 7) in the central portion of the substrate, between the cathode contacts 88 and the centrally-located disk-shaped anode 98a during the initial plating period ($t_5$-$t_6$).

The initial plating period $T_5$-$T_6$) is, for example, within 5000 msec, preferably from 0 to 3000 msec, after the initiation of plating.

Figure 16:
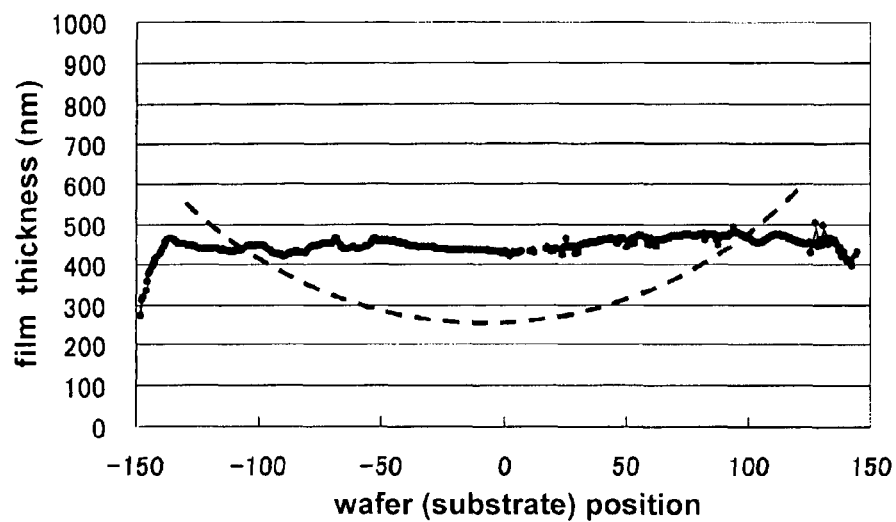
FIG. 16 is a graphical diagram, the solid-line graph showing the relationship between position on a wafer (substrate) and the thickness of a copper film, as observed when the copper film is formed on a surface of a ruthenium film (conductive layer) under the conditions (recipe) shown in FIGS. 15A and 15B, and the broken-line graph showing the relationship between position on a wafer (substrate) and the thickness of a copper film, as observed when the copper film is formed on a surface of a ruthenium film under ordinary plating conditions.

The solid-line graph of FIG. 16 shows the relationship between position on a 300-mm wafer (substrate) and the thickness of a copper film, as observed when the copper film is formed on a surface of a ruthenium film (conductive layer) as a seed layer, formed on the wafer, under the conditions (recipe) shown in FIGS. 15A and 15B using the disk-shaped anode 98a having a diameter of 150 mm. The broken-line graph of FIG. 16 shows, for reference, the relationship between position on a wafer and the thickness of a copper film, as observed when the copper film is formed on a surface of a ruthenium film under ordinary electroplating conditions, i.e., by passing a constant electric current between the ruthenium film and a disk-shaped anode, not a divided one, disposed opposite the ruthenium film for a predetermined period of time in the presence of a plating solution.

As can be seen from FIG. 16, when copper plating is carried out on the surface of the ruthenium film of the 300-mm wafer under the ordinary plating conditions, a copper film, whose thickness is thicker in the peripheral portion than in the central portion, is formed due to the terminal effect. In contrast, according to the plating method of this embodiment, a copper film of high in-plane uniformity can be formed.

The graph with the marks "●" of FIG. 16 shows the relationship between position on a 300-mm wafer (substrate) and the thickness of a copper film, as observed when initial copper plating is carried out on a surface of a ruthenium film (conductive layer) as a seed layer, formed on the wafer, by passing a plating current only between the cathode contacts 88 and the centrally-located disk-shaped anode 98a having a diameter of 150 mm without passing a plating current between the cathode contacts 88 and the peripherally-located ring-shaped anode 98b. The graph with the marks "X" of FIG. 16 shows, for reference, the relationship between position on a wafer (substrate) and the thickness of a copper film, as observed when initial copper plating is carried out in the above manner, but not using the sealing rings 154a, 154b between the upper end face of the partition plate 150 and the lower surface of the ceiling wall of the housing 94 and between the lower end face of the partition plate 150 and the upper surface of the porous structure 110.

Figure 17:
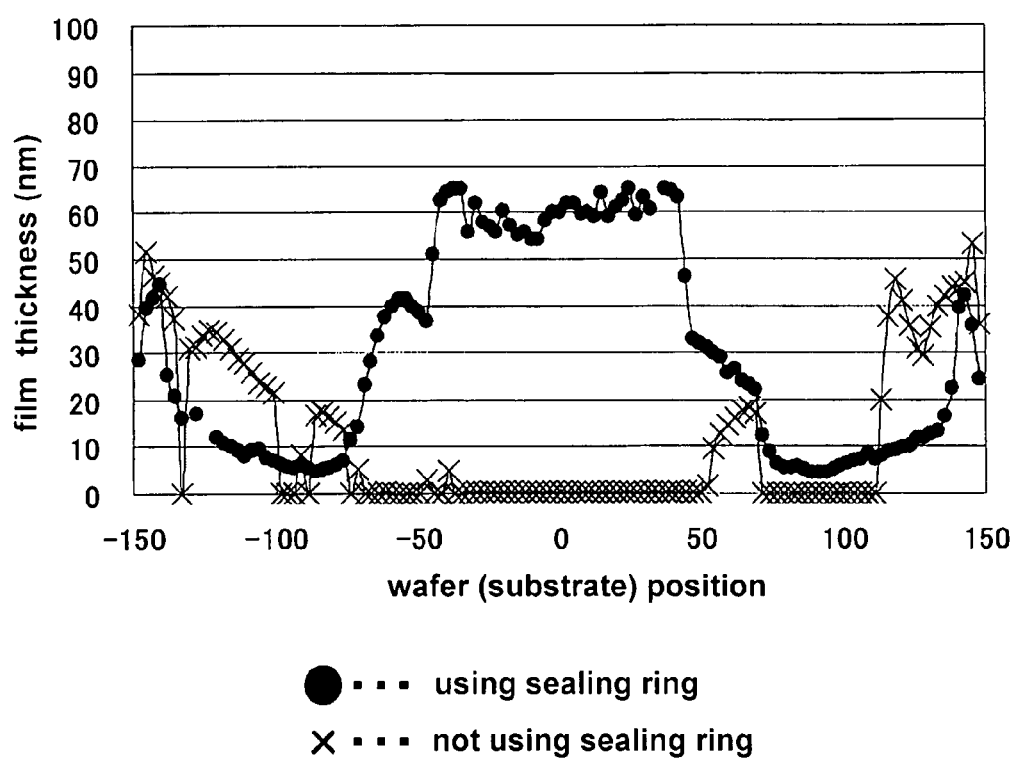
FIG. 17 is a graphical diagram, the graph with the marks "●" showing the relationship between position on a wafer (substrate) and the thickness of a copper film, as observed when initial copper plating is carried out on a surface of a ruthenium film (conductive layer) by the electroplating apparatus shown in FIG. 1, and the graph with the marks "x" showing the relationship between position on a wafer (substrate) and the thickness of a copper film, as observed when initial copper plating is carried out on a surface of a ruthenium film (conductive layer) by the electroplating apparatus shown in FIG. 1, but not using a sealing ring.

As can be seen from FIG. 17, by interposing the sealing rings 154a, 154b between the upper end face of the partition plate 150 and the lower surface of the ceiling wall of the housing 94 and between the lower end face of the partition plate 150 and the upper surface of the porous structure 110 to seal the gaps and thereby securely inhibit passage of a plating solution through the gaps, it becomes possible to form a copper film selectively in the central portion of a substrate by initial plating. The effect of the use of the divided anodes 98a, 98b can thus be maximized by the use of the sealing rings.

Of course, a sealing ring need not necessarily be used if sealing can be made between the upper end face of the partition plate 150 and the lower surface of the ceiling wall of the housing 94 and between the lower end face of the partition plate 150 and the upper surface of the porous structure 110, for example, by bringing the upper end face and the lower end face of the partition plate 150 into pressure contact with the lower surface of the ceiling wall of the housing 94 and the upper surface of the porous structure 110, respectively.

Figure 18:
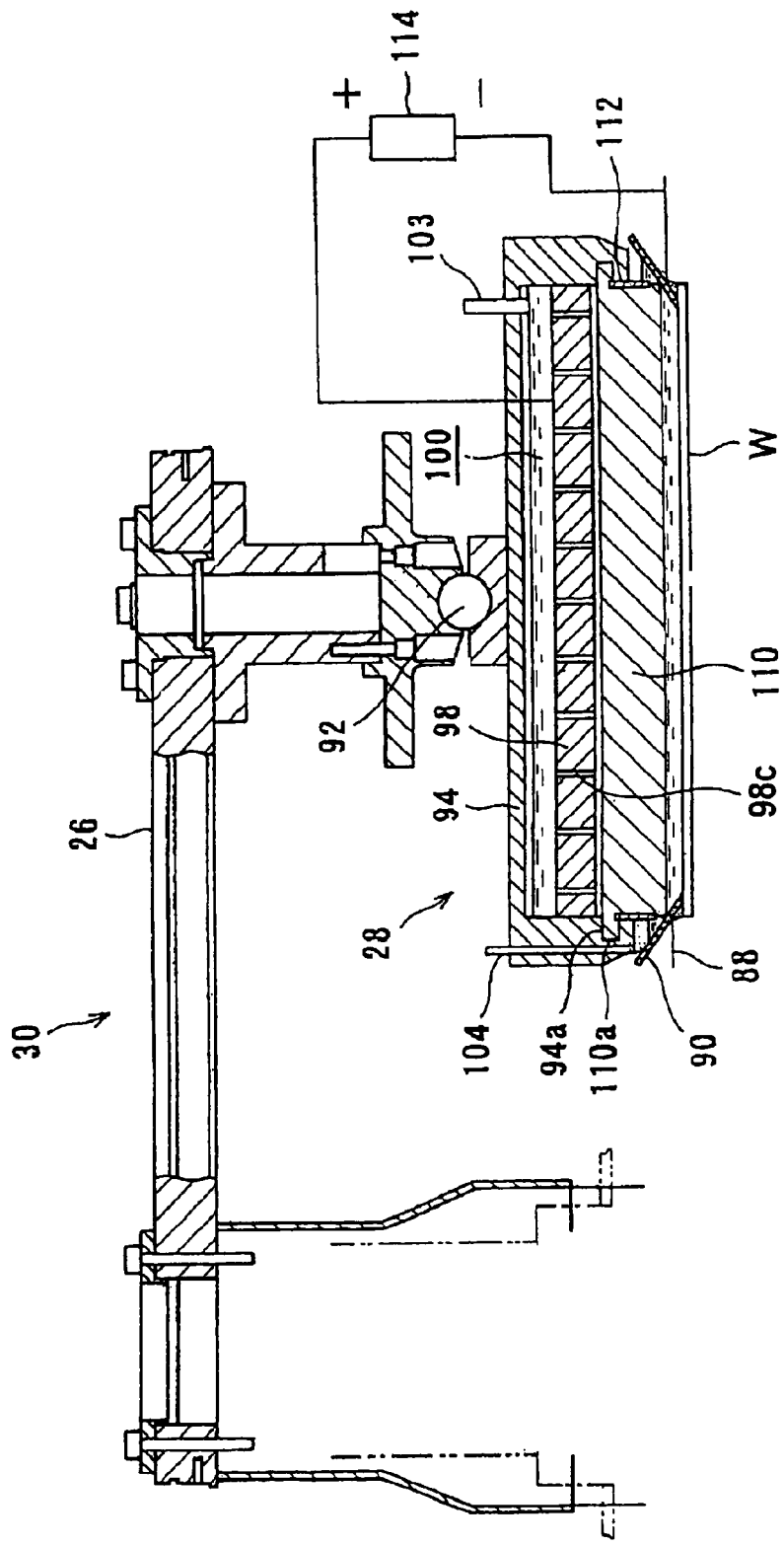
FIG. 18 is a cross-sectional diagram schematically showing the electrode head of another electroplating apparatus and a substrate held by the substrate holder when electroplating is performed.

FIG. 18 is a cross-sectional diagram schematically showing the electrode head of another electroplating apparatus and a substrate held by the substrate holder during electroplating. The electroplating apparatus shown in FIG. 18 differs from the above-described electroplating apparatus 12 shown in FIGS. 1 through 12 in that a disk-shaped anode 98 is disposed in the plating solution chamber 100 without provision of the partition plate 150 in the plating solution chamber 100, and a plating voltage is applied from a plating power source 114 to between the anode 98 and the cathode contacts 88, and that a plating solution in the plating solution chamber 100 is discharged out from a plating solution discharge outlet 103. The other construction of the apparatus of FIG. 18 is substantially the same as the electroplating apparatus 12 shown in FIGS. 1 through 12.

Using the electroplating apparatus shown in FIG. 18, plating of the surface of the seed layer 7 composed of a ruthenium film was carried out by passing a plating current, which will provide an ordinary level of average cathode current density $A_{10}$, e.g., 10 mA/cm$^2$ ($A_{10}$=10 mA/cm$^2$), for the conductive layer (seed layer 7) of the substrate, between the cathode contacts 88 and the anode 98 during an initial to intermediate plating period ($t_8$-$t_{10}$), and passing a plating current, which will provide an average cathode current density $A_{11}$, which is higher than the average cathode current density $A_{10}$ of the initial to intermediate plating period ($A_{11}$>$A_{10}$), for the conductive layer (seed layer 7) of the substrate, between the cathode contacts 88 and the anode 98 during a later plating period ($t_{10}$-$t_{11}$), as shown in FIG. 19A. As shown in 20A, haze "H" was observed in the peripheral portion of the plated film formed on the surface of the ruthenium film.

On the other hand, plating of the surface of the seed layer 7 composed of a ruthenium film was carried out by passing a plating current, which will provide an average cathode current density $A_{12}$ of, e.g., 40 mA/cm$^2$ ($A_{12}$≧40 mA/cm$^2$), which is higher than an ordinary value of, e.g., 10 mA/cm$^2$, for the conductive layer (seed layer 7) of the substrate, between the cathode contacts 88 and the anode 98 during an initial plating period ($t_8$-$t_9$), and passing an ordinary plating current between the cathode contacts 88 and the anode 98 during an intermediate to later plating period ($t_9$-$t_{11}$), as shown in FIG. 19B. As shown in 20B, no haze was observed in the peripheral portion of the plated film formed on the surface of the ruthenium film, and the entire surface of the plated film was found to be glossy.

The initial plating period ($t_8$-$t_9$) is, for example, within 5000 msec after the initiation of plating. It is possible to pass an electric current, which provides an average cathode current density of not less than 40 mA/cm$^2$ for the conductive layer of the substrate, a plurality of times within 5000 msec after the initiation of plating.

Figure 21:
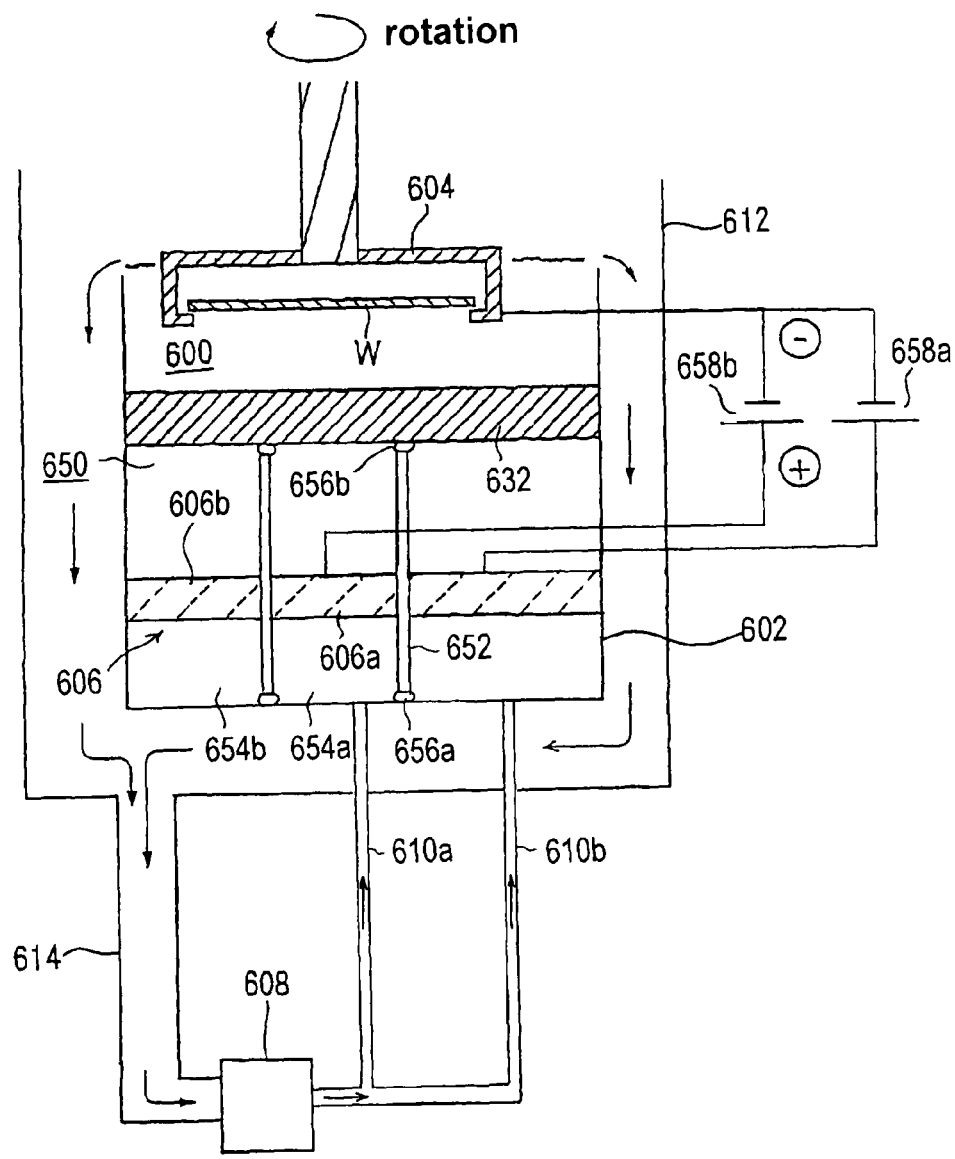
FIG. 21 is a schematic diagram showing an electroplating apparatus according to another embodiment of the present invention.

FIG. 21 shows an electroplating apparatus according to another embodiment of the present invention. This electroplating apparatus includes an upwardly-open cylindrical housing (plating cell) 602 for holding a plating solution 600 therein, and a rotatable substrate holder 604 for detachably holding a substrate W, such as a semiconductor wafer, with its front surface facing downwardly and positioning the substrate W at a position where the substrate W closes the top opening of the housing 602. In this embodiment, electricity is fed to the substrate W by its contact with cathode contacts (not shown) provided in the substrate holder 604, and a peripheral portion of the substrate W is sealed by a sealing member (not shown) when the substrate W is held by the substrate holder 604.

A porous structure 632 is disposed at the top opening of the housing 602, whereby a plating solution chamber 650 is formed in the housing 602. The plating solution chamber 650 is divided into two concentric rooms 654a, 654b by a cylindrical partition plate 652 of an insulating material. Sealing rings 656a, 656b of, e.g., rubber or Teflon ™ are interposed between the lower end face of the partition plate 652 and the upper surface of the bottom wall of the housing 602 and between the upper end face of the partition plate 652 and the lower surface of the porous structure 632. The partition plate 652 may be integral with the housing 602.

In the plating solution chamber 650 and below the porous structure 632 is disposed an anode 606 in a horizontal position. The anode 606 is comprised of two concentric divided anodes: a central disk-shaped anode 606a and a peripheral ring-shaped anode 606b. The disk-shaped anode (divided anode) 606a is disposed in the room 654a located centrally in the plating solution chamber 650, and the ring-shaped anode (divided anode) 606b is disposed in the room 654b located peripherally in the plating solution chamber 650. The anode 606 is comprised of, for example, a copper plate or an assembly of copper balls.

The disk-shaped anode (divided anode) 606a is to be electrically connected to the anode of a first plating power source 658a and the ring-shaped anode (divided anode) 606b is to be electrically connected to the anode of a second plating power source 658b, while the cathodes of the plating power sources 658a, 658b are to be electrically connected to the cathode contacts (not shown) of the substrate holder 604.

The housing 602 is connected at its bottom to plating solution supply pipes 610a, 610b which branch off from a plating solution supply pipe connected to a pump 608 and supply the plating solution 600 to the rooms 654a, 654b of the plating solution chamber 650. A plating solution receiver 612 is disposed outside the housing 602. The plating solution that has flowed into the plating solution receiver 612 is returned through a plating solution return pipe 614 to the pump 608.

When carry out plating, the substrate W, held face-down by the substrate holder 604, is positioned at the top of the housing 602 and rotated, and predetermined voltages are applied between the divided anodes 606a, 606b and the conductive layer (seed layer 7) of the substrate W while the plating solution 600 is introduced into the housing 602 by the actuation of the pump 608, thereby passing plating currents between the divided anodes 606a, 606b and the conductive layer (seed layer) of the substrate W and forming a plated film on the lower surface of the substrate W. During the plating, the plating solution that has overflowed the housing 602 is recovered in the plating solution receiver 612 and circulates.

This embodiment also enables the formation of a plated film having a uniform thickness on a surface of a substrate by performing the same control as described above.

According to this embodiment, a plated film having enhanced in-plane uniformity can be formed by using the divided anodes which are electrically insulated from each other, and passing different electric currents to the divided anodes. Further, by using a high current density, e.g., not less than 40 mA/cm$^2$, in an initial plating period, a glossy, good-quality plated film can be formed on a substrate having a conductive layer whose resistivity is equal to or higher than that of copper.

Figure 22:
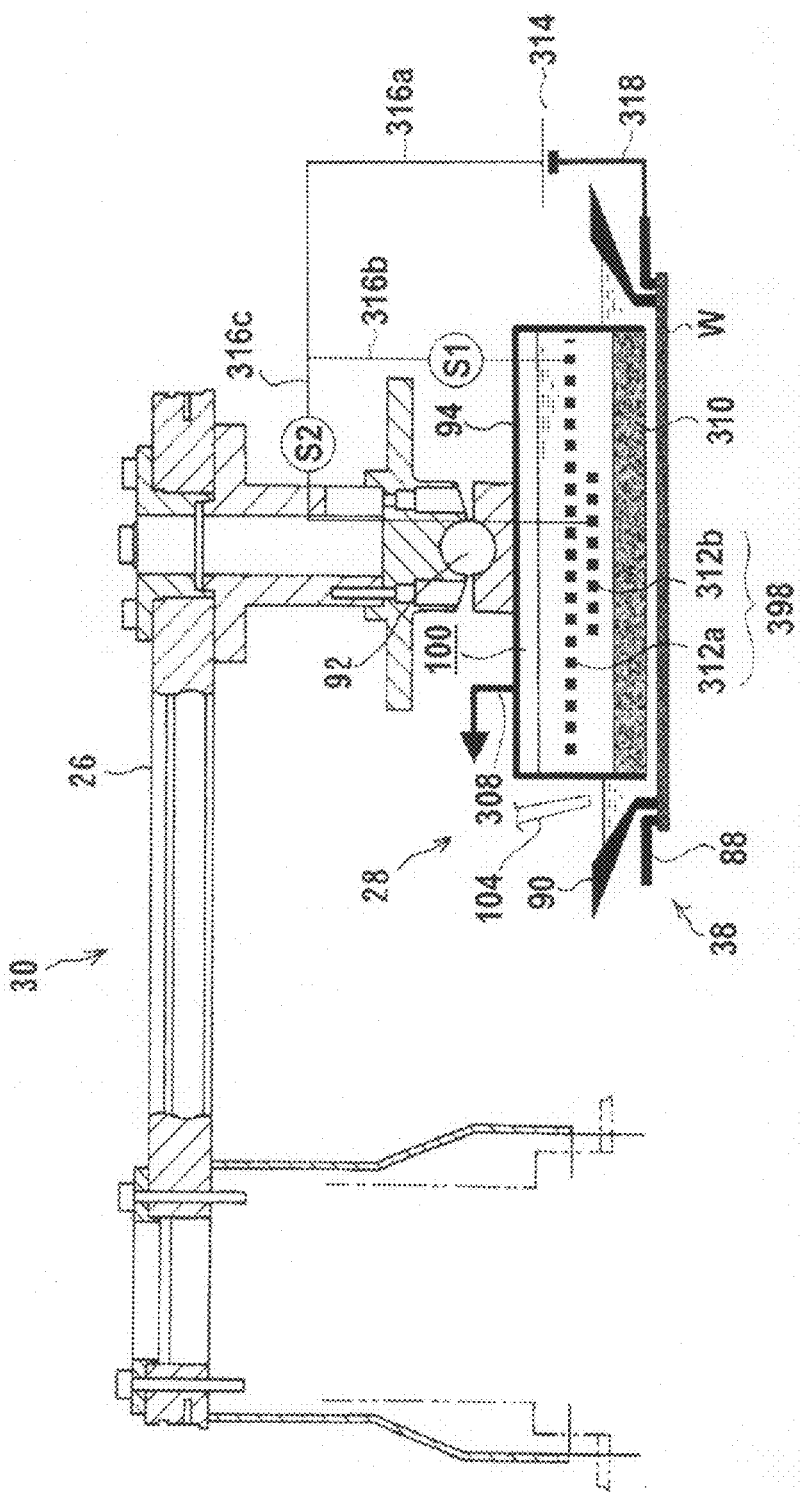
FIG. 22 is a cross-sectional diagram showing an electroplating apparatus according to yet another embodiment of the present invention.
Figure 23:
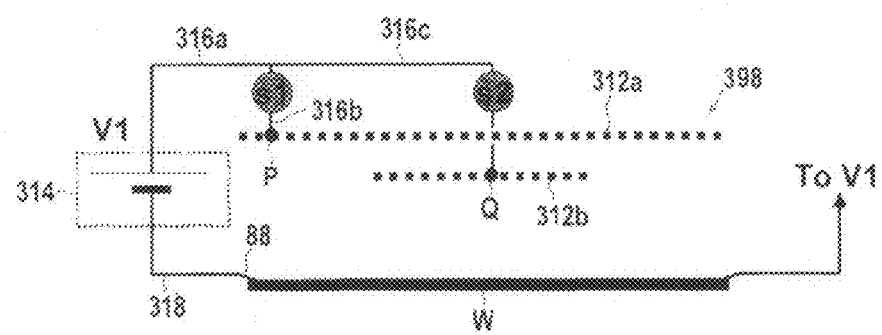
FIG. 23 is a schematic diagram illustrating the relationship of an anode, a rectifier and switches of the electroplating apparatus shown in FIG. 22.
Figure 24:
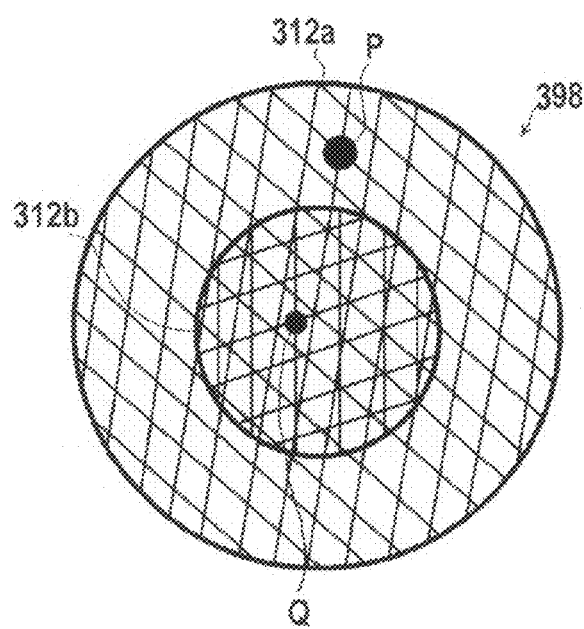
FIG. 24 is a rear view of the anode of the electroplating apparatus shown in FIG. 22.

FIGS. 22 through 24 show an electroplating apparatus according to yet another embodiment of the present invention. The electroplating apparatus shown in FIGS. 22 through 24 differs from the above-described electroplating apparatus shown in FIGS. 1 through 12 in the following respects. The same or equivalent members are given the same reference numerals, and a duplicate description thereof will be omitted.

A porous body 310 of a water-retentive material is disposed such that it closes the bottom opening of the housing 94. The porous body 310 may be composed of a porous ceramic, such as alumina, SiC, mullite, zirconia, titania or cordierite, or a hard porous structure, such as a sintered body of polypropylene or polyethylene, or a composite thereof, or a woven or non-woven fabric. For example, a porous ceramic plate may be used having a pore diameter of 30 to 200 μm in the case of an alumina ceramic, or not more than 30 μm in the case of SiC, a porosity of 20 to 95%, and a thickness of 1 to 20 mm, preferably 5 to 20 mm, more preferably 8 to 15 mm. In this embodiment, the porous body 310 is composed of a porous alumina ceramic plate, for example, having a porosity of 30% and an average pore diameter of 100 μm. Though the porous body 310, composed of such a porous ceramic plate, per se is an insulating material, it has an electric conductivity when it contains a plating solution. In particular, the plating solution penetrates the porous ceramic plate in the thickness direction though complicated, fairly long paths of the pores. This can provide the porous body containing the plating solution with an electric conductivity which is lower than the electric conductivity of the plating solution.

The provision of the porous body 310, which can thus have a high electric resistance, in the plating solution chamber 100 can make the influence of the resistance of the seed layer 7 (see FIG. 28A) as small as negligible. Thus, a difference in current density in the surface of the substrate W due to the electric resistance of the substrate surface can be made small, thereby enhancing the in-plane uniformity of a plated film. Though, in this embodiment, the porous body 310 is provided in order to increase the electric resistance of the plating solution, it is possible to omit the porous body 310.

As shown in FIG. 22, in the plating solution chamber 100 and above the porous body 310 is disposed an anode 398 comprised of a laminate of a disk-shaped first insoluble anode plate 312a extending horizontally over substantially the entire area of the plating solution chamber 100, and a disk-shaped second insoluble anode plate 312b having a smaller diameter than the first insoluble anode plate 312a and disposed such that it faces the central portion of the substrate W held by the substrate holder, the first and second anode plates 312a, 312b being arranged at a predetermined distance from each other. Furthermore, as shown in FIG. 22, the plates 312a, 312b are arranged along a direction of the center axis of the substrate W. As shown in detail in FIG. 24, the insoluble anode plates 312a, 312b according to this embodiment are concentric and each have the shape of a diamond mesh that allows passage therethrough of a plating solution, and are disposed parallel to the substrate W. It is also possible to use as the insoluble anode plates 312a, 312b ones having a large number of vertical through-holes throughout the plates.

The insoluble anode plates 312a, 312b are each comprised of, for example, a conductor with a surface coating of platinum or iridium oxide. The use of the laminate of insoluble anode plates 312a, 312b as the anode 398 can prevent a change in the shapes of the insoluble anode plates 312a, 312b due to their dissolution and can therefore maintain constant electric discharge without replacement of the insoluble anode plates 312a, 312b. Furthermore, a complicated geometric arrangement of the insoluble anode plates 312a, 312b becomes possible, enabling effective lamination of the insoluble anode plates 312a, 312b.

As shown in detail in FIG. 23, the first insoluble anode plate 312a is connected to a first anode conducting wire 316b that branches off from a common anode conducting wire 316a extending from the anode of a single rectifier (plating power source) 314, and the second insoluble anode plate 312b is connected to a second anode conducting wire 316c that branches off from the common anode conducting wire 316a. A first on/off switch S1 and a second on/off switch S2 are interposed in the first anode conducting wire 316b and the second anode conducting wire 316c, respectively. A cathode conducting wire 318 extending from the cathode of the rectifier 314 is connected to the cathode contacts 88.

When only the first switch S1 is turned ON, an electric field is generated between the first insoluble anode plate 312a and the substrate W; and when only the second switch S2 is turned ON, an electric field is generated between the second insoluble anode plate 312b and the substrate W. When both the first switch S1 and the second switch S2 are turned ON, an electric field comprising super position of the above two electric fields is generated over the surface of the substrate. It is thus possible, with a relatively simple construction, to easily control the electric field between the anode 398 and the central or peripheral portion of the substrate W which is connected to the cathode contacts 88 and serves as a cathode.

Figure 25:
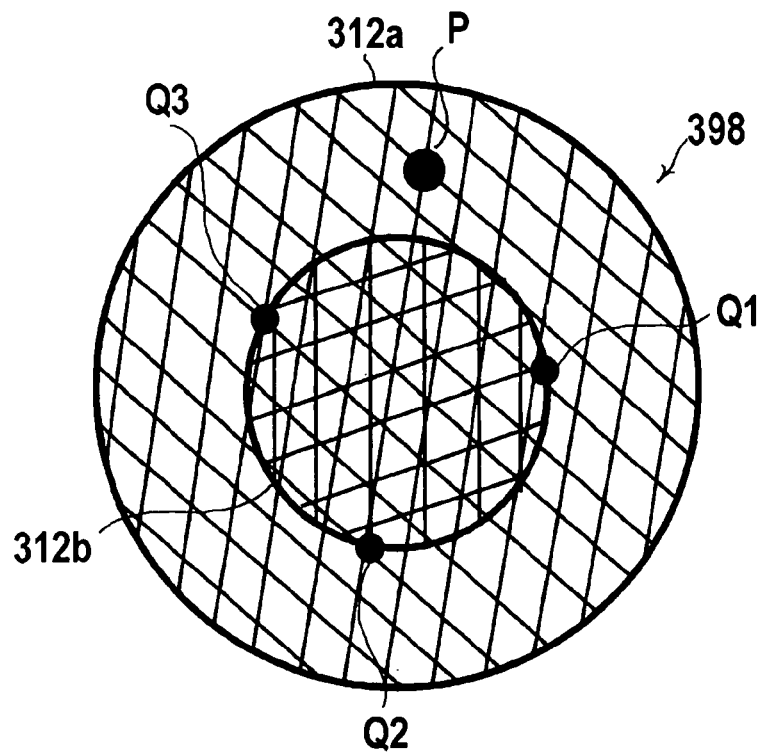
FIG. 25 is a rear view of another anode.

As shown in FIGS. 23 and 24, in this embodiment, the first insoluble anode plate 312a is connected, at its one surface point P, to the first anode conducting wire 316b, and the second insoluble anode plate 312b is connected, at its one surface point Q, to the second anode conducting wire 316c. It is, however, preferred especially for the second insoluble anode plate 312b, facing the central portion of the substrate W, to be connected at a plurality of its surface points, for example, three points Ql, Q2, and Q3, to the second anode conducting wire 316c, as shown in FIG. 25. This can generate a more uniform electric field between the second insoluble anode plate 312b and the central portion of the substrate W.

The housing 94 is provided with a plating solution discharge section (not shown) for sucking in and discharging a plating solution in the plating solution chamber 100. The plating solution discharge section is connected to a plating solution discharge pipe extending from the plating solution supply equipment 18 (see FIG. 1). The housing 94 is also provided with a plating solution injection section 104 located beside the housing 94. The plating solution injection section 104 is connected to a plating solution supply pipe extending from the plating solution supply equipment 18 (see FIG. 1).

When copper plating is carried out by using the insoluble anode plates 312a, 312b as the anode 398, oxygen gas is generated at the surfaces of the insoluble anode plates 312a, 312b and the oxygen gas, when it reaches the surface of the substrate W, will cause defects in a plated film formed on the substrate. In this embodiment, therefore, an air discharge port 308 is provided in the top wall of the housing 94, and the plating solution chamber 100 is evacuated through the air discharge port 308 during plating. Accordingly, the oxygen gas generated at the surfaces of the insoluble anode plates 312a, 312b passes through the plates and reaches the top region of the plating solution chamber 100, and is discharged out of the air discharge port 308. The oxygen gas thus can be prevented from reaching the surface of the substrate W.

In operation of the plating apparatus of this embodiment, the electrode head 28 is lowered and stopped when the porous body 310 has reached a position as close to the surface of the substrate W as about 0.5 mm to 3 mm. On completion of the lowering of the electrode head 28, a plating solution is injected from the plating solution injection section 104 into the region between the substrate W and the porous body 310 to fill the region with the plating solution.

Figure 26:
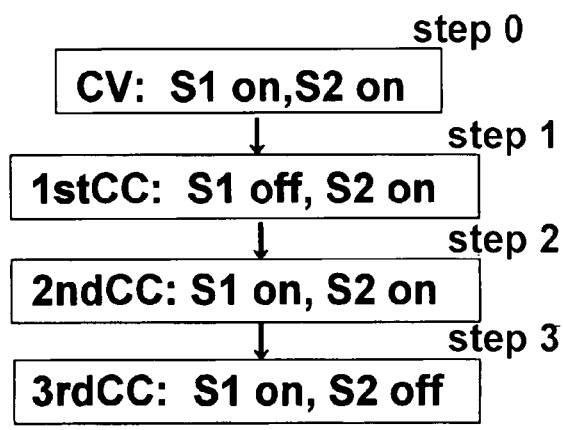
FIG. 26 is a diagram showing a typical recipe for the electroplating apparatus shown in FIG. 22.

During the filling of the plating solution, as shown in FIG. 26 with reference to step 0, for example, the first switch S1 and the second switch S2 are both turned ON so as to apply constant voltages (CV) between the first insoluble anode plate 312a and the substrate W and between the second insoluble anode plate 312b and the substrate W, thereby preventing a surface conductive layer, such as the seed layer 7 (see FIG. 28A), of the substrate W from being dissolved in the plating solution and etched.

Thereafter, in an initial plating period, the first switch S1 is turned OFF while the second switch S2 is turned ON, as shown in FIG. 26 with reference to step 1, to pass a constant current (CC) between the second insoluble anode plate 312b and the central portion of the substrate W, facing the second insoluble anode plate 312b, thereby generating an electric field only between the second insoluble anode plate 312b and the central portion of the substrate W and causing a plated film to grow only in the central portion of the substrate W. Next, in an intermediate plating period, as shown in FIG. 26 with reference to step 2, the first switch S1 and the second switch S2 are both turned ON to pass constant currents (CC) between the second insoluble anode plate 312b and the central portion of the substrate W, facing the second insoluble anode plate 312b, and between the first insoluble anode plate 312a and the entire plating area of the substrate W, facing the first insoluble anode plate 312a. The electric field thus generated between the second insoluble anode plate 312b and the central portion of the substrate W is higher than the electric field generated between the first insoluble anode plate 312a and the peripheral portion of the substrate W, which causes a plated film to grow preferentially in the central portion of the substrate W.

As the plated film grows on the substrate W, the surface resistance (sheet resistance) of the substrate W decreases and the terminal effect, which depends on the surface sheet resistance of the substrate, decreases gradually. Accordingly, the above plating, if continued in the same manner, will produce a plated film which is thick in the central portion of the substrate W and thin in the peripheral portion.

Therefore, in a final plating period after the thickness of the plated film has reached a predetermined value, the second switch S2 is turned OFF, as shown in FIG. 26 with reference to step 3, to pass a constant current (CC) between the first insoluble anode plate 312a and the entire plating area of the substrate W, facing the first insoluble anode plate 312a, thereby generating a uniform electric field between the first insoluble anode plate 312a and the entire plating area of the substrate W and causing a plated film to grow uniformly over the entire plating area of the substrate W.

By thus superposing plated films having different thickness distributions, a plated film having a uniform thickness distribution can be finally formed. Thus, it becomes possible to form a plated film having a more uniform thickness over an entire surface (surface to be plated) of a substrate even if the substrate has a high sheet resistance, ensuring filling of the metal into fine interconnect recesses, consisting of contact holes 3 and trenches 4 (see FIG. 28A), without the formation of voids therein.

According to this embodiment, a plated film having a more uniform thickness can be formed on a substrate having a high sheet resistance especially by utilizing a synergistic effect produced by the use of the anode 398 comprising a laminate of a plurality of (two) insoluble anode plates 312a, 312b arranged at a predetermined distance from each other, combined with the use of the porous body 310 of a water-retentive material, disposed between the substrate W held by the substrate holder and the anode 398.

Figure 27A:
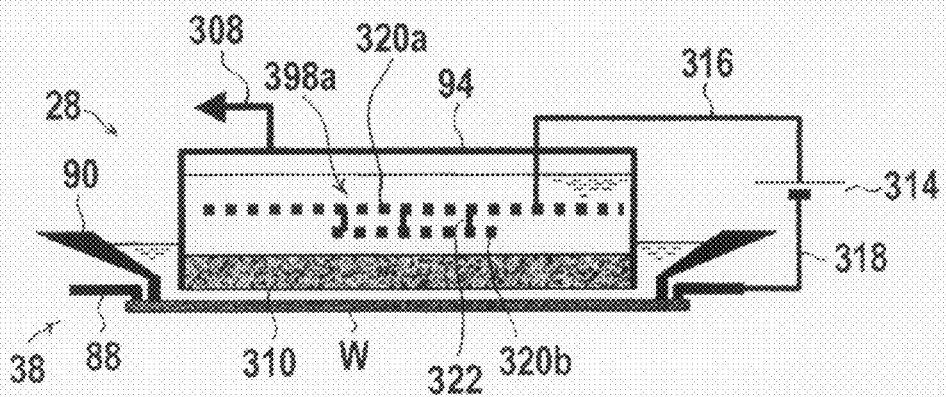
FIGS. 27A and 27B are cross-sectional diagrams showing the main portions of different electroplating apparatuses according to yet other embodiments of the present invention.

In this embodiment, two insoluble anode plates 312a, 312b are individually connected to the anode of the single rectifier 314, and the electric fields in the peripheral portion and the central portion of a substrate are controlled by switching of the two switches S1, S2. As shown in FIG. 27A, it is also possible to use an anode 398a comprised of a large-diameter first insoluble anode plate 320a and a small-diameter second insoluble anode plate 320b, which are concentric and arranged at a predetermined distance from each other, and are electrically connected by an electric conductor 322 having the shape of a coarse mesh, and to connect an anode conducting wire 316, extending from the anode of the rectifier 314, only to the second insoluble anode plate 320a of the anode 398a.

Figure 27B:
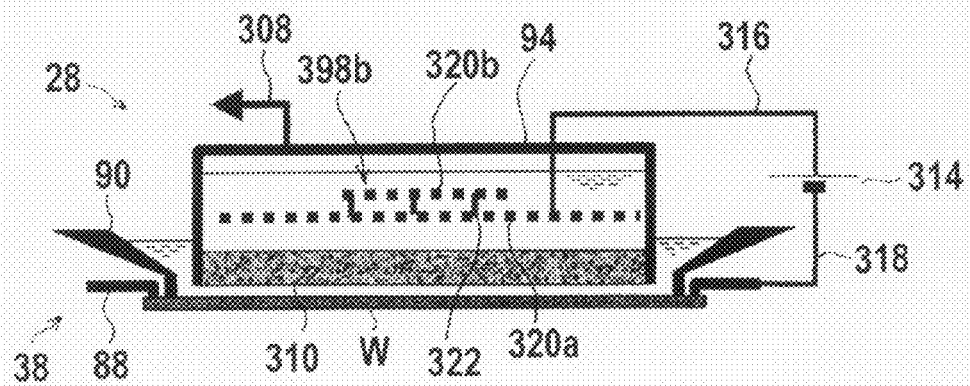

In the embodiment shown in FIG. 27A, the smaller-diameter second insoluble anode plate 320b is disposed closer to the substrate W, i.e., the distance between the second insoluble anode plate 320b and the substrate W is shorter than the distance between the first insoluble anode plate 320a and the substrate W. As shown in FIG. 27B, however, it is also possible to dispose the large-diameter first insoluble anode plate 320a closer to the substrate W, i.e., to make the distance between the first insoluble anode plate 320a and the substrate W shorter than the distance between the small-diameter second insoluble anode plate 320b and the substrate W.

According to these embodiments, an electric field can be concentrated in the central portion of the substrate W during plating so as to allow a plated film to grow preferentially in the central portion of the substrate. This enables the formation of a plated film having a more uniform thickness on the surface of the substrate even when the substrate has a high sheet resistance. Further, the use of insoluble anode plates enables a complicated geometric arrangement of the plates, including a non-concentric arrangement, thus enabling effective lamination of the insoluble anode plates.

According to the above-described embodiments, a plated film having a more uniform thickness can be securely formed even on a substrate having a high sheet resistance also by the provision of the porous body 310 between the anode 398 and the substrate W held by the substrate holder. Thus, as described above, the electric resistance of a plating solution between the anode 398 and the substrate W can be increased by impregnating the porous body 310 with the plating solution, thereby making the influence of the surface sheet resistance of the substrate as small as negligible. However, it is of course possible to omit the porous body 310.

Though copper is used as an interconnect material in the above embodiments, a copper alloy, silver or a silver alloy may also be used instead of copper.

According to the present invention, a plated film having a uniform thickness can be formed especially in the manufacturing of the 45-nm or later generation of semiconductor devices, which will require plating on a layer having a high sheet resistance, for example, a thin copper seed layer or a barrier layer of, e.g., ruthenium. The present invention is especially effective for an initial plating period when the sheet resistance of plated film is high. Further, the intensity of electric field can be arbitrarily adjusted for an intended surface portion of a substrate by laminating insoluble anode plates not only concentrically but also in any desired relative position.

While the present invention has been described with reference to the preferred embodiments thereof, it is understood that the present invention is not limited to the particular embodiments, but various modifications may be made therein within the technical concept of the invention. For example, the present invention is applicable not only to 300-mm wafers but also to next-generation wafers.

What is claimed is:
1. An electroplating apparatus comprising:
a substrate holder for holding a substrate;
a sealing member for contacting a peripheral portion of a surface of a substrate, held by the substrate holder, to seal the peripheral portion;
a cathode contact for contacting a conductive layer formed in the surface of the substrate; held by the substrate holder; to feed electricity to the conductive layer;
a housing having therein an anode to be immersed in a plating solution, and a porous structure disposed at an open end facing the substrate held by the substrate holder, said porous structure defining a plating chamber in the housing;
a partition plate for dividing the plating chamber into a plurality of rooms; and
a sealing ring interposed between the porous structure and the partition plate to seal a gap between the porous structure and the partition plate;
wherein the plating chamber is divided into rooms by the partition plate and the porous structure, and the anode is comprised of a plurality of divided anodes, each divided anode being disposed in a respective one of the rooms of the plating chamber so that each divided anode can pass an independent plating current.

2. The electroplating apparatus according to claim 1, wherein said sealing ring comprises a first sealing ring, further comprising a second sealing ring interposed between the partition plate and the housing to seal a gap between the partition plate and the housing.

3. The electroplating apparatus according to claim 1, wherein the anode is comprised of concentric divided anode segments, with a centrally-located divided anode segment being disk-shaped, and the partition plate has a cylindrical shape and is disposed such that it surrounds the circumference of the centrally-located divided anode segment located inside.

4. The electroplating apparatus according to claim 3, wherein the diameter of the disk-shaped centrally-located divided anode segment and the inner diameter of the partition plate, disposed such that it surrounds the circumference of the disk-shaped centrally-located divided anode segment, are each not more than ⅔ of the diameter of the substrate.

5. The electroplating apparatus according to claim 1, wherein the conductive layer comprises one of Cu, Ru, Ta, TaN, W, WNC, WC, Pt, ITO, Ti, and TiW.

6. An electroplating apparatus comprising:
a substrate holder for holding a substrate;
a cathode contact for contact with a conductive layer formed in a surface of the substrate, held by the substrate holder, to feed electricity to the conductive layer; and
an anode disposed to face the surface of the substrate held by the substrate holder, the anode comprising a laminate of a plurality of insoluble disk-shaped anode plates, the insoluble disk-shaped anode plates being arranged at a predetermined distance from each other along a direction of a center axis of the substrate, each insoluble disk-shaped anode plate either having a mesh-like shape or having holes throughout the insoluble disk-shaped plate;
wherein the region between the anode and the substrate held by the substrate holder is filled with a plating solution when carrying out plating of the surface of the substrate.

7. An electroplating apparatus comprising:
a substrate holder for holding a substrate;
a sealing member for contacting a peripheral portion of a surface of the substrate, held by the substrate holder, to seal the peripheral portion;
a cathode contact for contacting a conductive layer formed in the surface of the substrate, held by the substrate holder, to feed electricity to the conductive layer;
an anode disposed to face the surface of the substrate held by the substrate holder, the anode comprising a laminate of a plurality of insoluble disk-shaped anode plates, the insoluble disk-shaped anode plates being arranged at a predetermined distance from each other along a direction of a center axis of the substrate, each insoluble disk-shaped anode plate either having a mesh-like shape or having holes throughout the insoluble disk-shaped plate;

a porous body of a water-retentive material, the porous body being disposed between the anode and the substrate held by the substrate holder; and a mechanism for moving the porous body and the substrate held by the substrate holder relative to each other;

wherein the region between the anode and the substrate held by the substrate holder is filled with a plating solution when carrying out plating of the surface of the substrate.

* * * * *